(12) United States Patent
Kasai

(10) Patent No.: US 11,048,035 B2
(45) Date of Patent: Jun. 29, 2021

(54) LIGHT-EMITTING MODULE

(71) Applicant: NICHIA CORPORATION, Anan (JP)

(72) Inventor: Daisuke Kasai, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/985,449

(22) Filed: Aug. 5, 2020

(65) Prior Publication Data

US 2021/0041616 A1 Feb. 11, 2021

(30) Foreign Application Priority Data

Aug. 5, 2019 (JP) .............................. JP2019-143983

(51) Int. Cl.
| | |
|---|---|
| *F21V 8/00* | (2006.01) |
| *H01L 25/13* | (2006.01) |
| *H01L 33/58* | (2010.01) |
| *H01L 33/48* | (2010.01) |

(52) U.S. Cl.
CPC ......... *G02B 6/0021* (2013.01); *G02B 6/0055* (2013.01); *G02B 6/0068* (2013.01); *H01L 25/13* (2013.01); *H01L 33/486* (2013.01); *H01L 33/58* (2013.01)

(58) Field of Classification Search
None
See application file for complete search history.

(56) References Cited

U.S. PATENT DOCUMENTS

| | | | |
|---|---|---|---|
| 2005/0265029 A1 | 12/2005 | Epstein et al. | |
| 2018/0239193 A1 | 8/2018 | Hayashi | |
| 2019/0227382 A1 | 7/2019 | Watanabe et al. | |

FOREIGN PATENT DOCUMENTS

| | | |
|---|---|---|
| JP | 2018106826 A | 7/2018 |
| JP | 2018133304 A | 8/2018 |
| KR | 20090117419 A | 11/2009 |
| WO | 2012141094 A1 | 10/2012 |

*Primary Examiner* — Vip Patel
(74) *Attorney, Agent, or Firm* — Hunton Andrews Kurth LLP

(57) ABSTRACT

A light-emitting module includes: a lightguide plate including a first primary surface, a second primary surface opposite to the first primary surface, and unit regions arranged in a one-dimensional or two-dimensional array, and defining first recesses in the first primary surface, each of the first recesses located in a respective one of the unit regions; light sources disposed at the first primary surface of the lightguide plate and each disposed in the first recess of a corresponding one of the unit regions; and a plurality of light-transmissive members each disposed in the first recess in a respective one of the unit regions so as to cover at least a portion of each lateral surface of its corresponding light source. The unit regions include at least one first unit region, in which an upper surface of the light-transmissive member forms a first depression extending toward a bottom of the first recess.

8 Claims, 17 Drawing Sheets

LIGHT-EMITTING MODULE

CROSS-REFERENCE TO RELATED APPLICATION

This application claims priority to Japanese Patent Application No. 2019-143983, filed on Aug. 5, 2019, the disclosure of which is hereby incorporated by reference in its entirety.

BACKGROUND

The present disclosure relates to a light-emitting module.

Light-emitting devices using light-emitting elements such as light-emitting diodes have been widely used for backlight devices for display devices such as liquid crystal display devices.

In particular, direct-type backlight devices are used to increase the brightness of the display device or to perform partial driving for increasing a contrast of an image contrast.

In recent years, for some applications, there is a demand for decreasing a thickness of a display device with a direct-type backlight device as much as possible, and accordingly there may be a demand for also decreasing a thickness of the direct-type backlight device as much as possible.

For example, Japanese Patent Publication No. 2018-133304 describes a light-emitting module in which a lightguide plate is provided with light-diffusing lenses and light-emitting elements are bonded to the lightguide plate. With such a configuration, it is possible to obtain a thin light-emitting module.

SUMMARY

In a light-emitting module in which light-emitting elements are attached to the lightguide plate, there may be a demand for locally adjusting the light distribution characteristics on the light-emitting surface. The present disclosure provides a light-emitting module in which the light distribution characteristics on the light-emitting surface can be locally adjusted.

A light-emitting module according to one embodiment of the present disclosure includes: a lightguide plate including a first primary surface, a second primary surface opposite to the first primary surface, and a plurality of unit regions arranged in a one-dimensional or two-dimensional array, and the lightguide plate defining a plurality of first recesses in the first primary surface, each of the first recesses located in a respective one of the plurality of unit regions; a plurality of light sources disposed at the first primary surface of the lightguide plate, each of the plurality of light sources disposed in the first recess in a corresponding one of the plurality of unit regions; and a plurality of light-transmissive members each disposed in the first recess in a respective one of the plurality of unit regions so as to cover at least a portion of each of lateral surfaces of the light source. The plurality of unit regions include at least one first unit region. In the at least one first unit region, an upper surface of the light-transmissive member forms a first depression that extends toward a bottom of the first recess.

According to the present disclosure, a light-emitting module can be obtained in which the light distribution characteristics of the light-emitting surface can be locally adjusted.

DETAILED DESCRIPTION

Figure 1A:
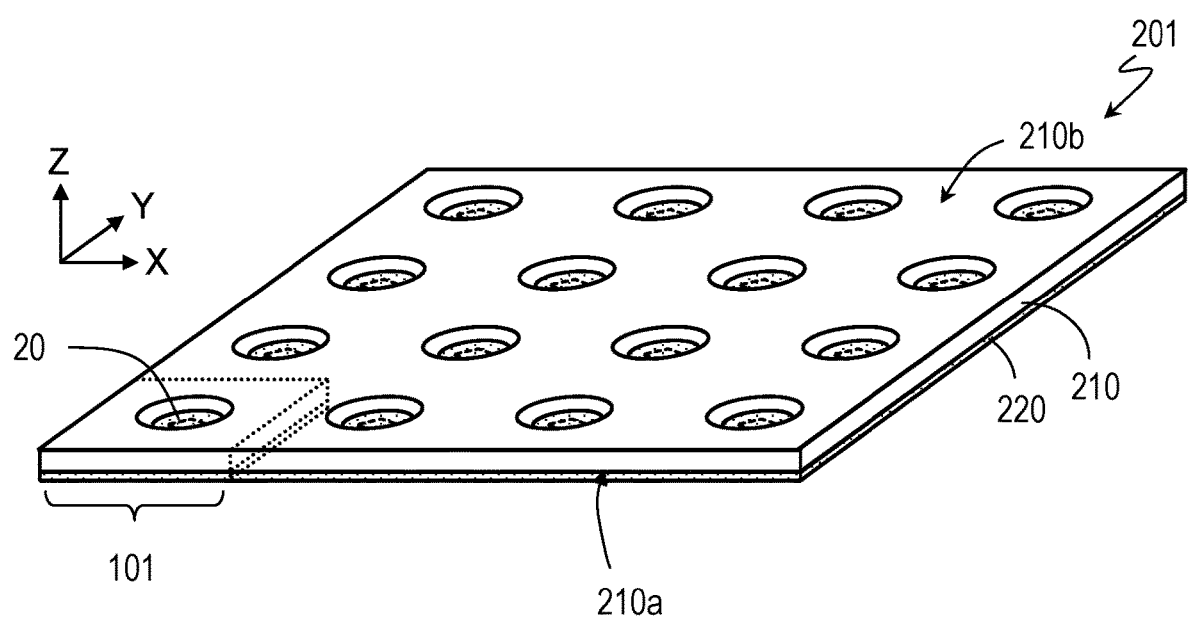
FIG. 1A is a schematic perspective view showing a light-emitting module according to a first embodiment of the present disclosure.

When a light-emitting unit including light-emitting elements bonded to a lightguide plate, such as the lightguide plate described in Japanese Patent Publication No. 2018-133304, is used for a direct-type backlight device for a display device, for example, using a single light-emitting unit corresponding to the screen size of the display device may be considered. In such a case, many light-emitting elements need to be arranged in an array on, and bonded to, a single lightguide plate corresponding to the screen size. Therefore, for example, if the light emitting-elements bonded to the single lightguide plate include a light-emitting element that does not emit light or are not arranged at appropriate positions, the light-emitting unit may become defective as a whole, so that the production yield may be reduced.

In order to avoid such reduction of the production yield, producing a plurality of light-emitting units each having a size corresponding to a respective one of a plurality of regions of the screen of the display devices and arranging the plurality of light-emitting units may be considered. For example, a plurality of light-emitting elements are arranged in an array on, and are bonded to, a lightguide plate having a rectangular shape with sides each having a length of several centimeters in a plan view, so that a small light-emitting unit can be obtained. Thereafter, a plurality of small light-emitting units can be arranged in a two-dimensional array, which can be used for a backlight device that corresponds to a large screen as a whole.

The number of light-emitting elements bonded to the small light-emitting unit is smaller than the number of light-emitting elements to be arrayed on and bonded to a lightguide plate having the size of the entirety of the screen, and accordingly it is possible to increase the production yield. Moreover, varying the number of small light-emitting units to be arranged allows for corresponding to various screen sizes of display devices, so that it is possible to reduce the manufacturing cost as compared with a case of providing a light-emitting unit having a lightguide plate corresponding to a screen size of a respective display device.

Such a light-emitting module, which can be used for display devices of various sizes, can be used for various applications such as displaying images, displaying information on various apparatuses or on vehicles such as automobiles.

In such a case, it is thought that, in some application, a light-emitting module can be applicable to a wider variety of applications and can be used in a new mode different from conventional modes of use, if it is possible to locally adjust the light distribution characteristic on the emission surface of the light-emitting module.

In view of this, the present disclosure allows for providing a novel light-emitting unit. Certain embodiments of the present disclosure will be described in detail with reference to the drawings. The embodiments described below are illustrative, and a method of manufacturing a lightguide collective substrate and a light-emitting unit of the present disclosure is not limited thereto. For example, the numerical values, shapes, materials, steps, and the order of steps, etc., to be shown in the embodiments described below are merely examples, and various modifications can be made thereto so long as they do not lead to technical contradictions. The embodiments described below are merely illustrative, and may be in various combinations as long as they do not lead to technical contradictions.

The size, the shape, etc., of the components shown in the figures may be exaggerated for the ease of understanding, and they may not represent the size and the shape of the components, the size relationship therebetween in an actual light-emitting module. Illustration of some components may be omitted in order to prevent the figures from becoming excessively complicated.

In the following description, components having substantially the same function may be denoted by the same reference numeral and duplicative description thereof may be omitted. Terms indicating specific directions and positions (e.g., "upper", "lower", "right", "left", and other terms including such terms) may be used in the description below. These terms are used merely for the ease of understanding relative directions or positions in the figure being referred to. The arrangement of components in figures of the present disclosure may not be the same as those in documents other than the present disclosure, actual products, actual manufacturing apparatuses, etc., as long as it conforms with the directional or positional relationship as indicated by terms such as "upper" and "lower" in the figure being referred to. In the present disclosure, the term "parallel" encompasses cases where two straight lines, sides, planes, etc., are in the range of about 0±5°, unless otherwise specified. In the present disclosure, the term "perpendicular" or "orthogonal" encompasses cases where two straight lines, sides, planes, etc., are in the range of about 90±5°, unless otherwise specified.

FIRST EMBODIMENT

Structure of Light-emitting Module 201

Figure 1B:
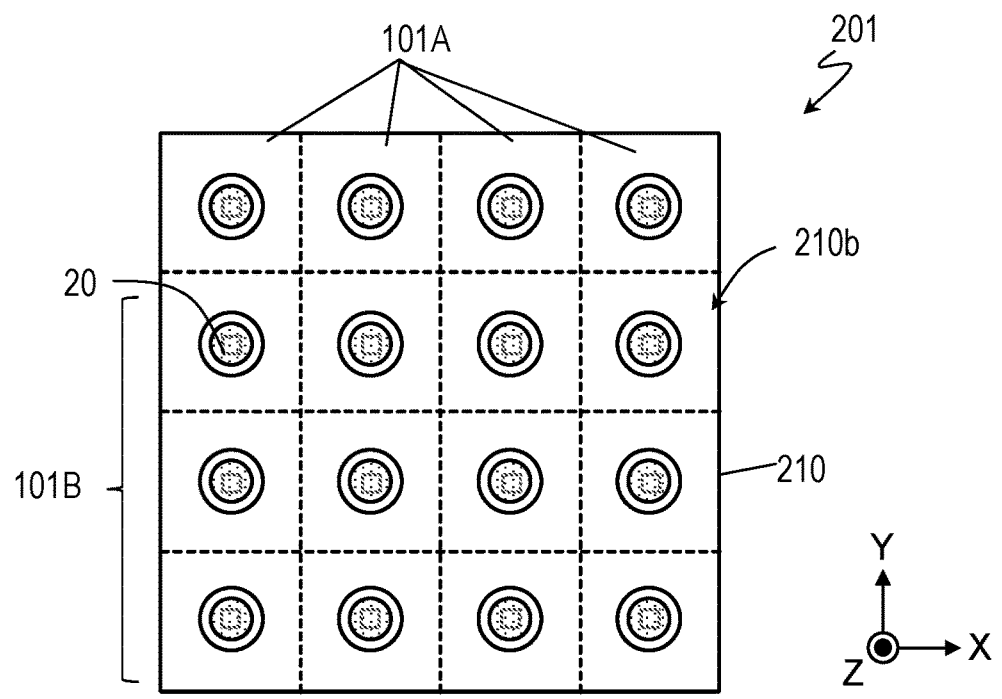
FIG. 1B is a schematic top view of the light-emitting module shown in FIG. 1A.
Figure 1C:
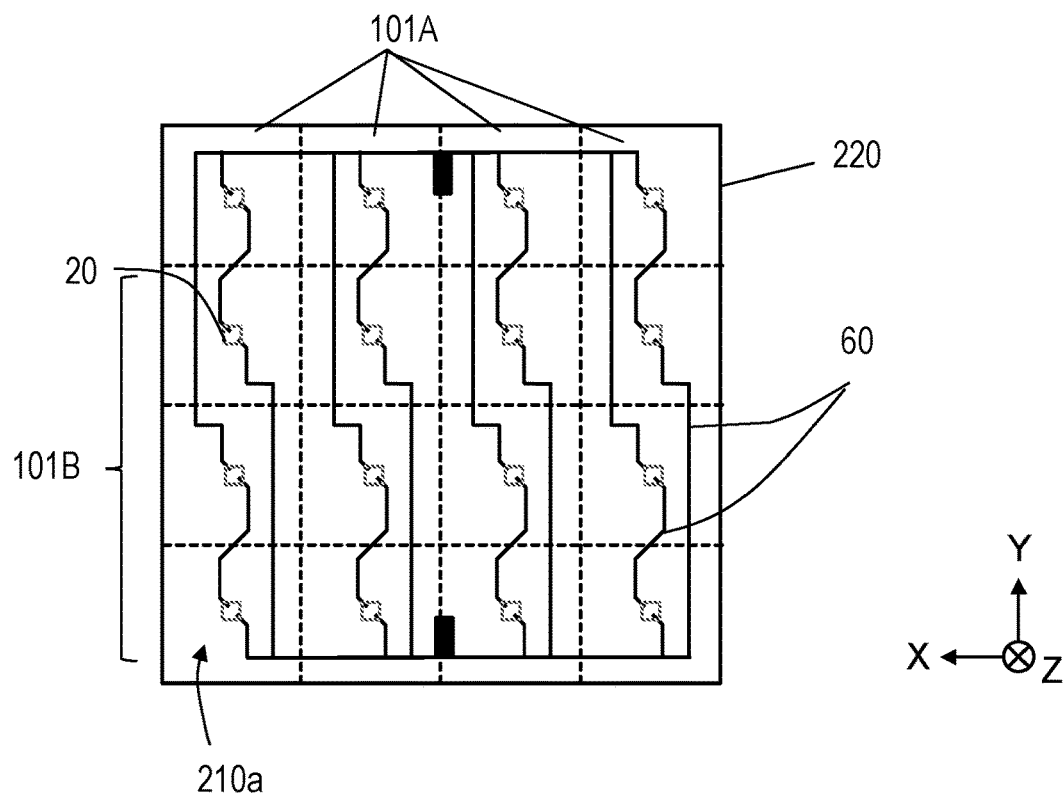
FIG. 1C is a schematic bottom view of the light-emitting module shown in FIG. 1A.

FIG. 1A is a schematic perspective view showing a light-emitting module 201 according to a first embodiment of the light-emitting module of the present disclosure. FIG. 1B and FIG. 1C are a schematic top view and a schematic bottom view of the light-emitting module 201. The light-emitting module 201 has a plate shape as a whole. The light-emitting module 201 includes a lightguide plate 210, a plurality of light sources 20, and a light-reflective layer 220. FIG. 1A also shows arrows in the X direction, the Y direction and the Z direction, which are perpendicular to each other, for ease of illustration. Arrows indicating these directions may be also shown in other figures of the present disclosure. The X direction and the Y direction are also the first direction and the second direction, respectively.

Figure 2A:
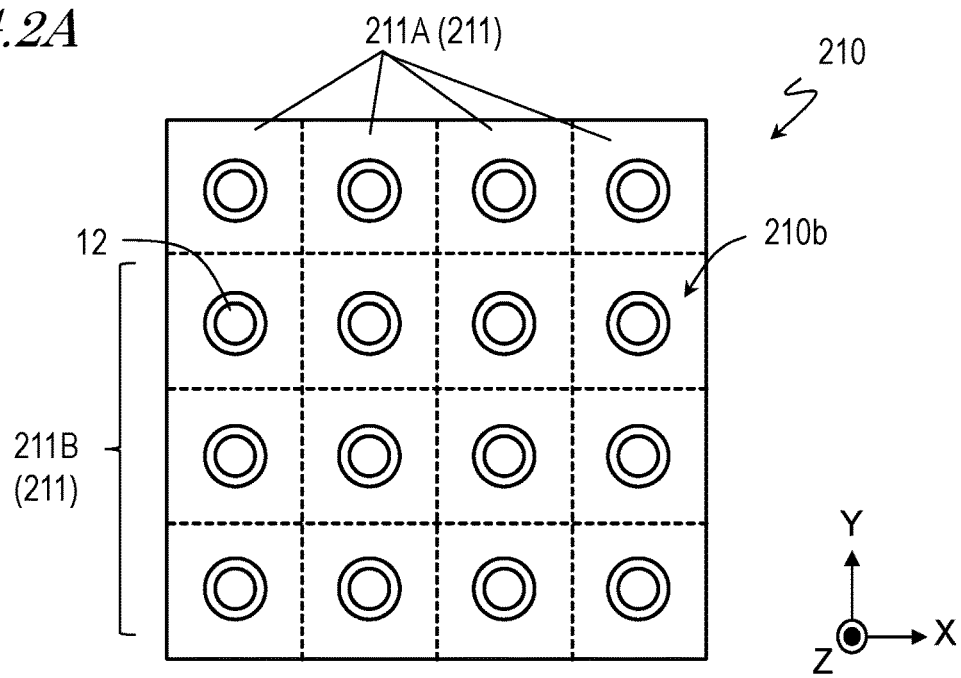
FIG. 2A is a schematic top view of a lightguide plate of the light-emitting module shown in FIG. 1A.
Figure 2B:
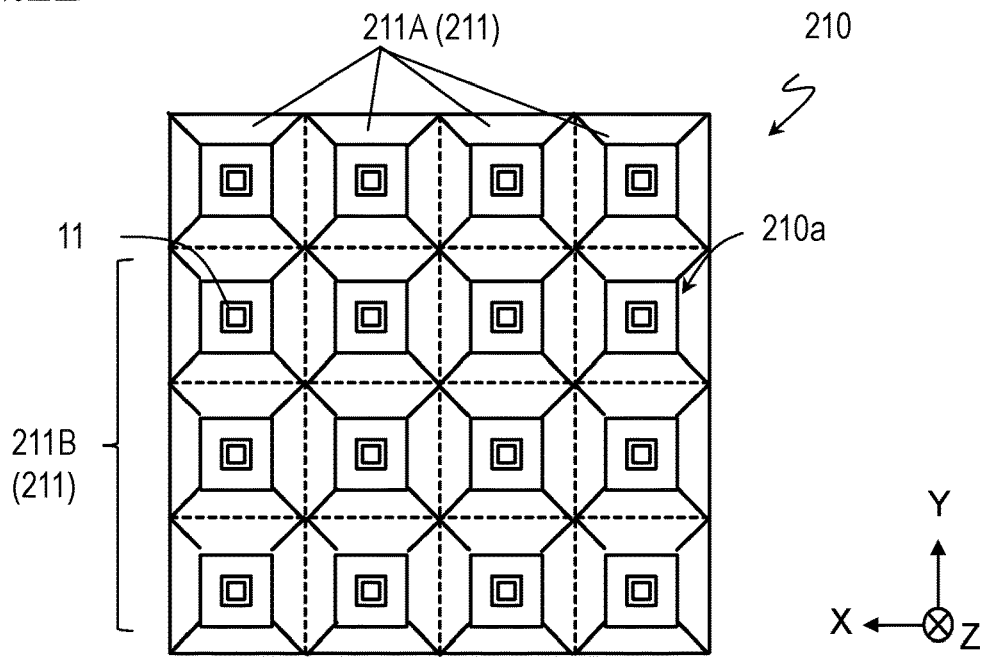
FIG. 2B is a schematic bottom view of the lightguide plate of the light-emitting module shown in FIG. 1A.
Figure 2C:
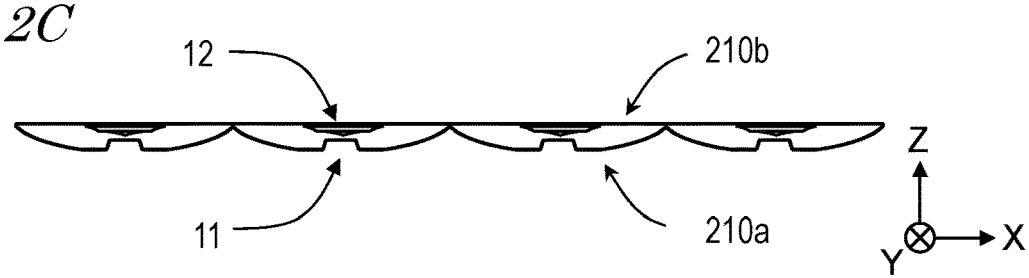
FIG. 2C is a schematic cross-sectional view of the lightguide plate of the light-emitting module shown in FIG. 1A.

FIG. 2A, FIG. 2B and FIG. 2C are a schematic top view, a schematic bottom view and a schematic cross-sectional view, respectively, of the lightguide plate 210. The lightguide plate 210 has a first primary surface 210a and a second primary surface 210b opposite to the first primary surface 210a, and has a lightguide structure in which light emitted from a plurality of light sources 20 arranged respectively in a plurality of first recesses 11 defined in the first primary surface 210a is emitted from the second primary surface 210b. Light emitted from the light sources 20 is reflected at the first primary surface 210a of the light-reflective layer 220. The second primary surface 210b is the light-emitting surface of the light-emitting module 201. Typically, the second primary surface 210b of the lightguide plate 210 has a rectangular shape. The X direction and the Y direction described above coincide with two opposite sides, perpendicular to each other, of the rectangular shape of the lightguide plate 210. One of sides of the rectangular shape of the second primary surface 210b has a length in the range of 1 cm or more and 200 cm or less, for example. In a typical embodiment of the present disclosure, one sides of the rectangular shape of the second primary surface 210b of the lightguide plate 210 has a length of 10 mm or more and 30 mm or less. The rectangular shape of the second primary surface 210b may have a longitudinal length and a lateral length of, for example, about 24.3 mm and about 21.5 mm, respectively.

As shown in FIG. 2A and FIG. 2B, the first primary surface 210a and the second primary surface 210b of the lightguide plate 210 are demarcated into a plurality of unit regions 211, which are arranged in a one-dimensional or two-dimensional array, such that each unit region 211 forms a light-emitting unit 101 in FIG. 1A. In this example, the lightguide plate 210 includes sixteen unit regions 211 arranged in a two-dimensional array, in which the sixteen unit regions 211 are arranged in four rows by four columns. Any appropriate number and arrangement of unit regions 211 may be employed in the lightguide plate 210. That is, the number and arrangement of light-emitting units 101 included in the light-emitting module 201 may be other than those shown in FIG. 1A to FIG. 1C, etc.

The plurality of light-emitting units 101 include at least one first light-emitting unit 101A. In the present embodiment, the plurality of light-emitting units 101 include four first light-emitting units 101A. The plurality of light-emitting units 101 further include second light-emitting units 101B. As shown in FIG. 2A and FIG. 2B, of the plurality of unit regions 211, the first unit regions 211A correspond to the first light-emitting units 101A, and the second unit regions 211B correspond to the second light-emitting units 101B.

Figure 3A:
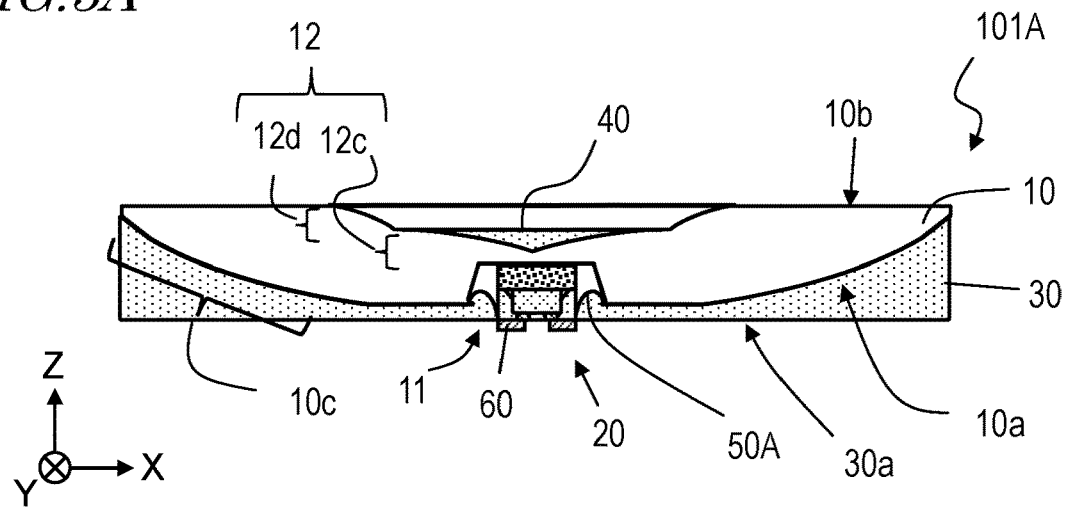
FIG. 3A is a schematic cross-sectional view of a first light-emitting unit of the light-emitting module shown in FIG. 1A.
Figure 3B:
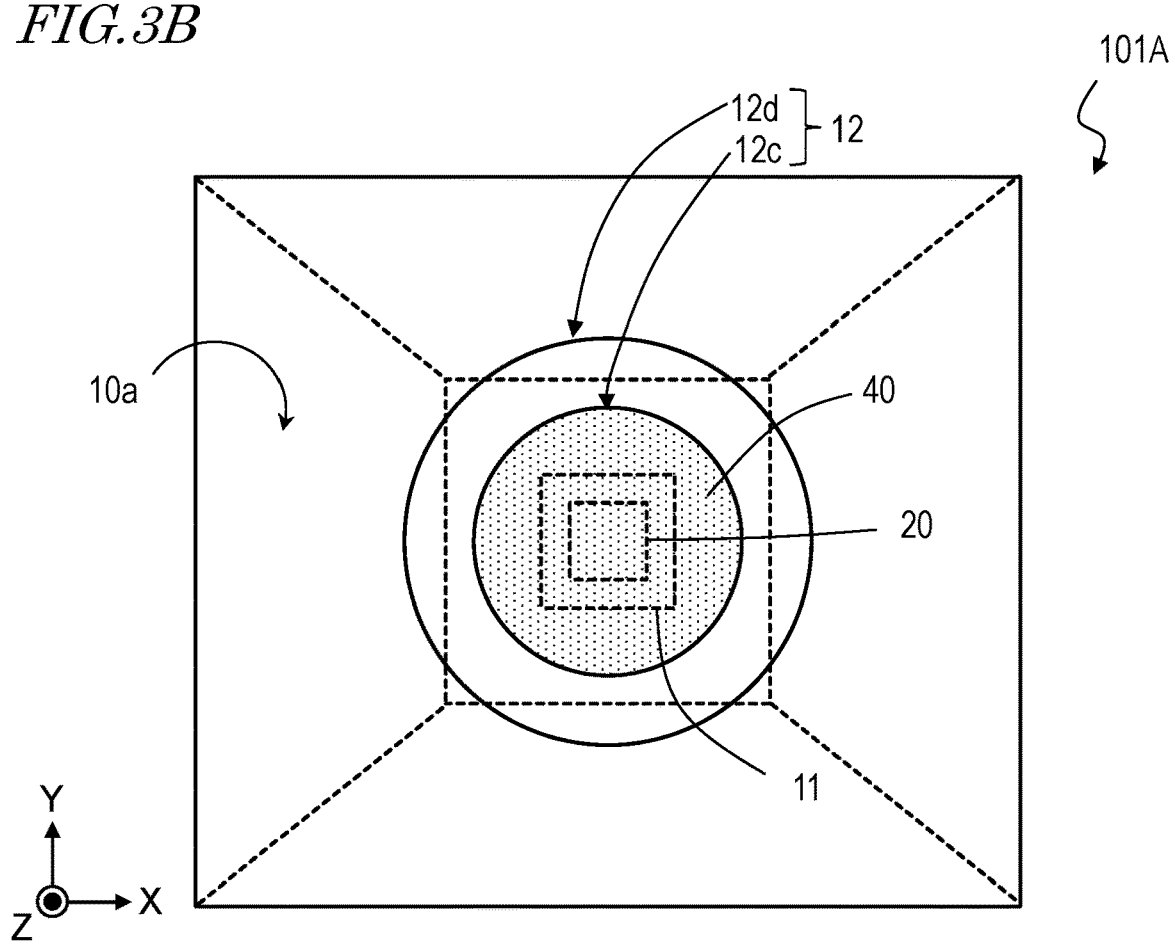
FIG. 3B is a schematic top view of the first light-emitting unit of the light-emitting module shown in FIG. 1A.
Figure 4A:
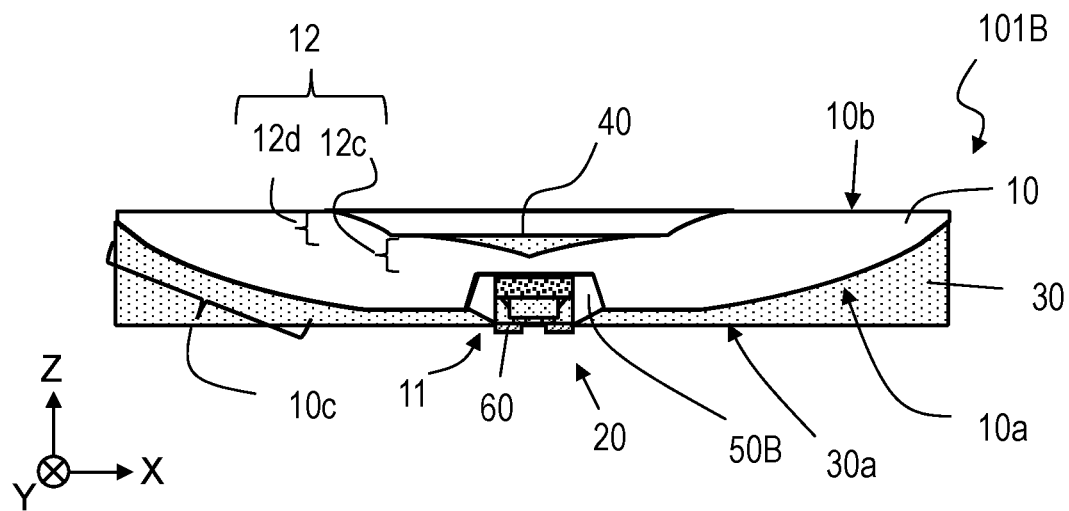
FIG. 4A is a schematic cross-sectional view of a second light-emitting unit of the light-emitting module shown in FIG. 1A.
Figure 4B:
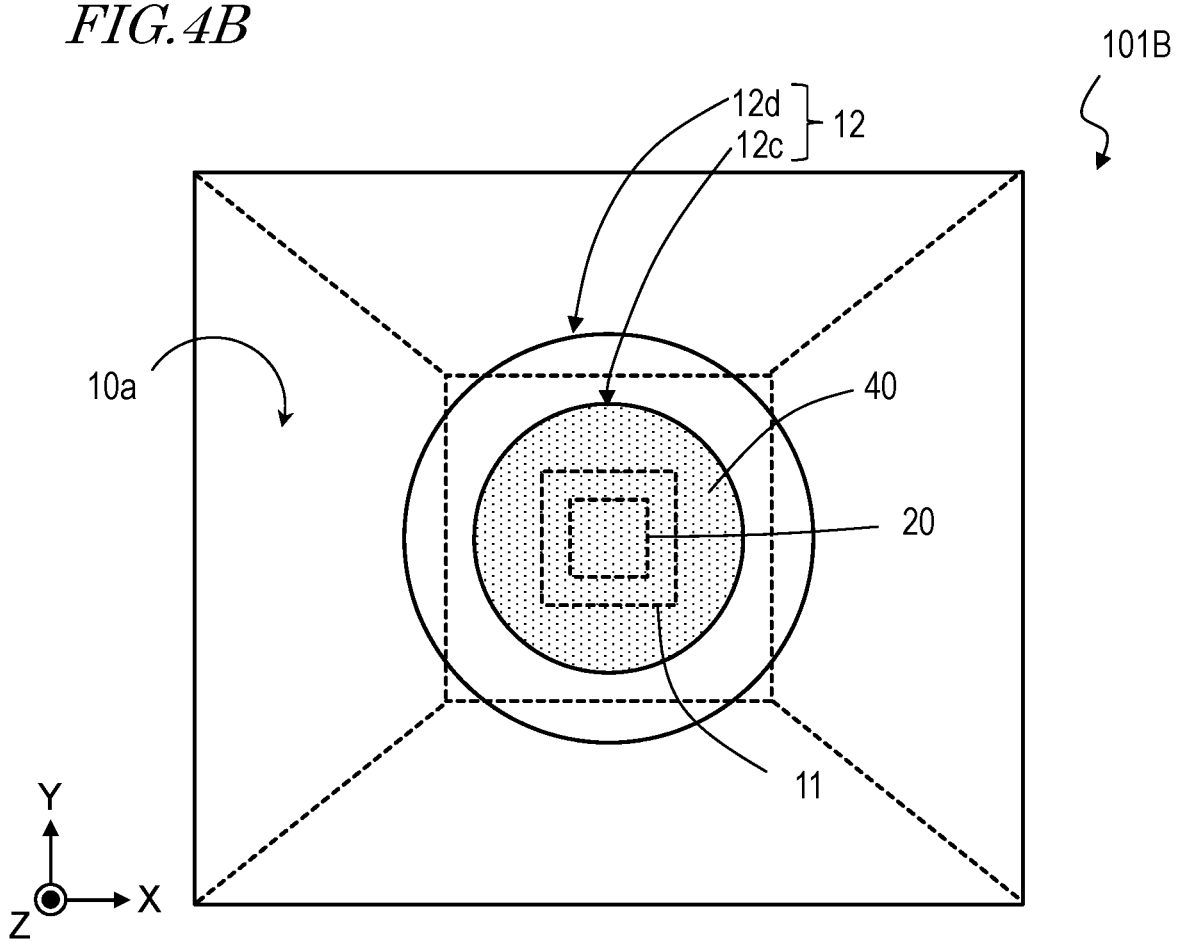
FIG. 4B is a schematic top view of the second light-emitting unit of the light-emitting module shown in FIG. 1A.

FIG. 3A and FIG. 3B are a schematic cross-sectional view and a schematic top view, respectively, of each of the first light-emitting units 101A, and FIG. 4A and FIG. 4B are a schematic cross-sectional view and a schematic top view, respectively, of each of the second light-emitting units 101B. As will be described below in detail, the first light-emitting unit 101A and the second light-emitting unit 101B differ from each other in that light-transmissive members 50A and 50B used for fixing the light source 20 to the lightguide plate 210 have different shapes from each other, so that the first light-emitting unit 101A and the second light-emitting unit 101B can therefore have different light distribution characteristics from each other. The structures of each of the first light-emitting units 101A and each of the second light-emitting units 101B will be described in detail. The first light-emitting units 101A and the second light-emitting units 101B may be referred to collectively as light-emitting units 101. The light-transmissive members 50A and 50B may be referred to collectively as light-transmissive members 50.

Each light-emitting unit 101 includes a lightguide plate 10, the light source 20 and the light-transmissive member 50. Each light-emitting unit 101 may further include a light-reflective layer 30, a light-reflective member 40 and a wiring layer 60.

Lightguide Plate 10

The lightguide plate 10 is a portion of the lightguide plate 210, shown in FIG. 1A, etc., that corresponds to a unit region 211. The lightguide plate 10 supports the light source 20. The lightguide plate 10 has a lightguide structure that allows light emitted from the light source 20 to be emitted from a surface of the lightguide plate 10 as uniformly as possible. More specifically, the lightguide plate 10 has a first primary surface 10a and a second primary surface 10b opposite to the first primary surface 10a, and the first recess 11 defined in the first primary surface 10a. The first recess 11 has, for example, an inverted quadrangular pyramidal shape in which an lower surface, serving as a bottom of the first recess 11, is smaller than an upper surface, serving as an opening of the first recess 11, when seen from the first primary surface 10a. In the present embodiment, the inverted quadrangular pyramidal shape is oriented such that four sides of the upper surface of the first recess 11 and four sides defining the opening of the first recess 11 are substantially parallel to respective corresponding four sides of the unit region 211. Alternatively, the inverted quadrangular pyramidal shape may be oriented such that diagonal lines of the upper surface and diagonal lines the opening are generally parallel to the four sides of the unit region 211. The light source 20 is disposed in the first recess 11.

The first primary surface 10a of the lightguide plate 10 may have a curved surface portion 10c for reflecting light traveling toward the first primary surface 10a. For example, the curved surface portion 10c is located in the peripheral region of each unit region 211 of the first primary surface 10a. With the light-reflective layer 30 disposed on the first primary surface 10a, light incident at a small angle upon the first primary surface 10a is totally reflected at the curved surface portion 10c toward the second primary surface 10b, which allows for increasing light extraction efficiency.

The lightguide plate 10 may include a lens structure for adjusting the light distribution of light emitted from the second primary surface. More specifically, the lens structure is a second recess 12 defined in the second primary surface 10b. For example, the second recess 12 includes a first portion 12c having an inverted conical shape, and a second portion 12d having an inverted truncated conical shape, when seen from the second primary surface 10b. In FIG. 3A, A tip portion of the inverted conical shape is located at the inner side of the lightguide plate 10, and a lower surface of the inverted truncated conical shape is in contact with a upper surface of the inverted conical shape. It is preferable that, in a plan view, i.e., when viewed from above the second primary surface 10b or the first primary surface 10a, the center of the second recess 12 coincides with the center of the first recess 11.

Figure 3C:
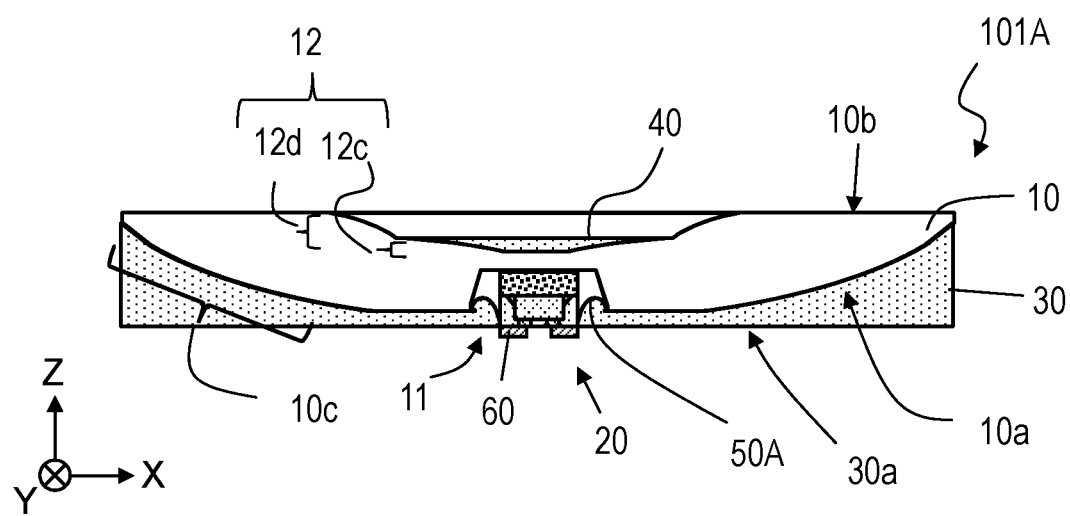
FIG. 3C is a schematic cross-sectional view of the first light-emitting unit of the light-emitting module shown in FIG. 1A, showing another variation of the lightguide plate.

The lightguide plate 10 may include a lens structure other than that in the example described above, and the lightguide plate 10 may include a lens structure having any other shape. For example, as shown in FIG. 3C, the second recess 12, which is the lens structure of the lightguide plate 10, may include the first portion 12c having an inverted truncated conical shape and the second portion 12d having an inverted truncated conical shape.

The lens structure controls the light emission direction utilizing the optical refraction at the boundary between the inner lateral surface defining the second recess 12 or a surface serving as a bottom of the second recess 12 and the external environment. In the present embodiment, the light-reflective member 40 is disposed in the first portion 12c of the second recess 12.

The lightguide plate 10 is made of a thermoplastic resin such as acrylic, polycarbonate, cyclic polyolefin, polyethylene terephthalate or polyester, a thermosetting resin such as epoxy or silicone, or a light-transmissive material such as a glass. For example, the lightguide plate 210 including a plurality of lightguide plates 10 connected together in a two-dimensional array can be formed through injection molding using a mold corresponding to the first recess 11, the curved surface portion 10c and the second recess 12.

Light-reflective Member 40

When the lightguide plate 10 includes the second recess 12, the light-reflective member 40 may be disposed in the first portion 12c of the second recess 12. With the light-reflective member 40 disposed above the light source 20, a portion of the light emitted from the light source can be reflected toward the first primary surface 10a. With the first portion 12c having a conical shape, light reflected at the interface between the lightguide plate 10 and the light-reflective member 40 is further diffused and travels toward the first primary surface 10a. Therefore, light from the light source 20 can be more efficiently diffused across a plane of the lightguide plate 10. Moreover, with the light-reflective member 40 is disposed to face the light source 20, the brightness on the second primary surface 10b of the lightguide plate 10 can be prevented from being excessively higher in a region directly above the light source 20 than in other regions. Further, with the light-reflective member 40 disposed selectively inside the first portion 12c of the second recess 12, excessive decrease of the brightness in a region directly above the light source 20 can be prevented. Accordingly, light with improved uniformity can be emitted while reducing the overall thickness of the light-emitting unit 101.

The light-reflective member 40 is made of a light-reflective material, such as a resin material in which a light-reflective filler is dispersed. The term "reflective", "light-reflective" as used herein refers to having a reflectance of 60% or more at the emission peak wavelength of the light source 20. The light-reflective member 40 at the emission peak wavelength of the light source 20 is preferably 70% or more, and more preferably 80% or more.

For a base material of a resin material used for the light-reflective member 40, a silicone resin, a phenolic resin, an epoxy resin, a BT resin, a polyphthalamide (PPA), etc., can be used. For the light-reflective filler, metal particles, or particles of an inorganic or organic material having a higher refractive index than that of the base material. Examples of the light-reflective filler include particles of titanium dioxide, silicon oxide, zirconium dioxide, potassium titanate, aluminum oxide, aluminum nitride, boron nitride, mullite, niobium oxide, barium sulfate, or particles of various rare earth oxides such as yttrium oxide or gadolinium oxide. It is preferable that the light-reflective member 40 is white.

The light-reflective filler may be distributed substantially uniformly or may be distributed with unevenness or a gradient, in the light-reflective member 40. For example, the filler may be sedimented or separated from the base material before the base material is cured in the step of forming the light-reflective member 40, which causes unevenness in the distribution of the light-reflective filler in the light-reflective member 40.

The number density of the filler, which refers to the number of filler particles per unit area in a plan view, is preferably higher near the center of the light-reflective member 40 than near the outer edge of the light-reflective member 40, which allows for facilitating preventing the brightness in the region directly above the light source 20 from being locally excessively high.

Light-reflective Layer 30

The light-reflective layer 30 is a portion of the light-reflective layer 220 shown in FIG. 1A, etc., that corresponds to the unit region 211, and covers the first primary surface 10a of the lightguide plate 10. It is preferable that the light-reflective layer 30 further covers the light-transmissive member 50. With the light-reflective layer 30 covering the first primary surface 10a, light incident upon the first primary surface 10a of the lightguide plate 10 is reflected toward the second primary surface 10b.

The light-reflective layer 30 can be formed using materials described above as examples of the material of the light-reflective member 40.

Wiring Layer 60

The wiring layer 60 is disposed on a first primary surface 30a of the light-reflective layer 30, and is electrically connected to the light sources 20. As shown in FIG. 1C, each portion of the wiring layer 60 electrically connects light sources 20 of corresponding ones of the light-emitting units 101 on the first primary surface 30a of the light-reflective layer 30 of the light-emitting module 201. The circuit to be formed by the wiring layer 60 is determined in accordance with the manner of driving the light-emitting units 101 of the light-emitting module 201. For example, when the light-emitting units 101 of the light-emitting module 201 are driven simultaneously, eight series circuits may be connected in parallel, in which each series circuit includes respective two of the light sources 20 of the light-emitting units 101 arranged in four rows by four columns. Alternatively, the light sources 20 of the light-emitting units 101 arranged in four rows by four columns are grouped into two or more groups to be driven simultaneously.

The wiring layer 60 may typically be a single-layer film or a layered film made of a metal such as Cu.

Light Source 20

Figure 5:
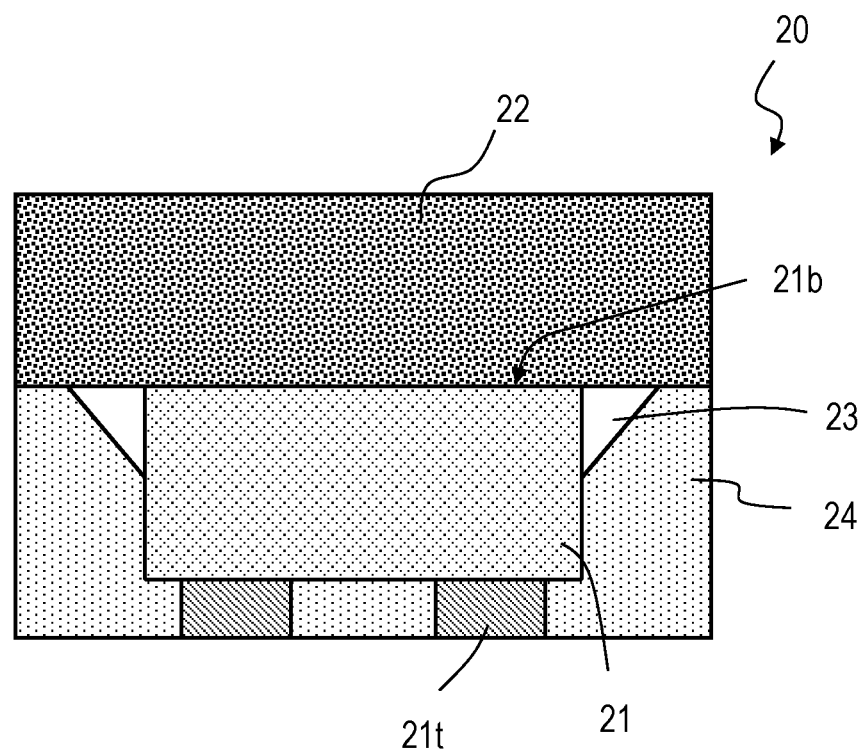
FIG. 5 is a schematic cross-sectional view of a light source 20 of the light-emitting module shown in FIG. 1A.

FIG. 5 is a schematic cross-sectional view of each light source 20. The light source 20 is arranged in the first recess 11 of the lightguide plate 10. In the present embodiment, the light source 20 includes a light-emitting element 21, a wavelength conversion member 22, a bonding member 23 and a light-reflective member 24.

A typical example of the light-emitting element 21 is an LED. For example, the light-emitting element 21 includes a support substrate of sapphire or gallium nitride, etc., and a semiconductor layered structure on the support substrate. The semiconductor layered structure includes an n-type semiconductor layer, a p-type semiconductor layer, an active layer disposed between the n-type semiconductor layer and the p-type semiconductor layer, and electrodes 21t each electrically connected to a respective one of the n-type semiconductor layer and the p-type semiconductor layer. The semiconductor layered structure may include a nitride semiconductor ($In_xAl_yGa_{1-x-y}N$, $0 \leq x$, $0 \leq y$, $x+y \leq 1$) adapted to emit light in the ultraviolet to visible range.

For the light-emitting element 21, an element configured to emit blue light or an element configured to emit white light can be used. The light-emitting elements 21 of the plurality of light-emitting units 101 may include elements configured to emit light of colors different from each other. For example, the light-emitting elements 21 of the plurality of light-emitting units 101 may include elements configured to emit red light, elements configured to emit blue light, and elements configured to emit green light. In the present embodiment, an example in which an LED configured to emit blue light is used for the light-emitting element 21 will be described.

The light-emitting element 21 typically has a rectangular shape in a plan view. Each side of the rectangular shape of the light-emitting element 21 in a plan view has a length of, for example, 1000 μm or less. The rectangular shape of the light-emitting element 21 in a plan view may have a length of 500 μm or less along each of the x and y directions. Light-emitting elements having a size of 500 μm or less along each of the x and y directions can be obtained at low cost. Alternatively, the rectangular shape of the light-emitting element 21 may have a size of 200 µm or less along each of the x and y directions. When the light-emitting element 21 is applied for a backlight device unit for a liquid crystal display device, small length of each side of the rectangular shape of the light-emitting element 21 is preferably advantageous for, for example, rendering high-definition images and performing local dimming. In particular, when a light-emitting element has a size of 250 µm or less along each of the y direction and the x direction, the area of the upper surface is reduced, so that the amount of light emission from lateral surfaces of the light-emitting element can be relatively increased. Therefore, a batwing light distribution characteristic can be easily obtained. The term "batwing light distribution characteristics" generally refers to a light distribution characteristics having an emission intensity distribution in which the emission intensity is higher at angles at which the absolute value of the light distribution angle is greater than 0°, where the optical axis that is perpendicular to the upper surface of the light-emitting element is set as 0°.

The wavelength conversion member 22 is disposed on an emission surface 21b of the light-emitting element 21. The wavelength conversion member 22 is adapted to absorbs at least a portion of light emitted from the light-emitting element 21 and to emit light of a different wavelength than the wavelength of the light from the light-emitting element 21. For example, the wavelength conversion member 22 is adapted to convert the wavelength of a portion of blue light emitted from the light-emitting element 21 to emit yellow light. With such a configuration, blue light that passes through the wavelength conversion member 22 and yellow light that is emitted from the wavelength conversion member 22 are mixed together, so that white light is obtained. The light emitted from the light-emitting element 21 is basically introduced into the lightguide plate 10 through the wavelength conversion member 22. Therefore, the mixed light is diffused inside the lightguide plate 10, so that light, for example white light, with reduced unevenness in luminance can be extracted from the second primary surface 10b of the lightguide plate 10. In this regard, using the light source 20 of the present embodiment is advantageous for the uniformity of the light as compared with diffusing light in the lightguide plate and then converting the wavelength of the diffused light.

The wavelength conversion member 22 is typically a member in which particles of a phosphor are dispersed in a resin. Examples of the resin in which particles of a phosphor, or the like, are dispersed include a silicone resin, a modified silicone resin, an epoxy resin, a modified epoxy resin, a urea resin, a phenol resin, an acrylic resin, a urethane resin, a fluorine resin, and a resin that includes two or more of these resins. In order to efficiently introduce light into a lightguide plate 110A, the base material of the wavelength conversion member 22 preferably has a lower refractive index than that of a material of the lightguide plate 110A. A material having a refractive index different than that of the base material of the wavelength conversion member 22 may be dispersed in the wavelength conversion member 22, which allows the wavelength conversion member 22 to diffuse light. For example, particles of titanium dioxide, silicon oxide, etc., may be dispersed in the base material of the wavelength conversion member 22.

A known material may be used for the phosphor. Examples of the phosphor include a fluoride-based phosphor such as a YAG-based phosphor or a KSF-based phosphor, a nitride-based phosphor such as CASN, and a β-SiAlON phosphor. A YAG-based phosphor is an example of a wavelength conversion substance adapted to convert blue light into yellow light, a KSF-based phosphor and CASN are examples of a wavelength conversion substance adapted to convert blue light into red light, and a β-SiAlON phosphor is an example of a wavelength conversion substance adapted to convert blue light into green light. A quantum dot phosphor may be used for the phosphor.

It is not necessary that the same phosphor is contained in the wavelength conversion members 22 of a plurality of the light-emitting modules 201. The phosphor dispersed in the base material of the wavelength conversion member 22 may vary between different light-emitting modules 201.

The bonding member 23 is a light-transmissive member that covers at least a portion of each of the lateral surfaces of the light-emitting element 21 and a portion of a surface of the wavelength conversion member 22 facing the light-emitting element 21, and bonds the wavelength conversion member 22 and the light-emitting element 21 together. Although not shown in FIG. 5, the bonding member 23 may be located also between the light-emitting element 21 and the wavelength conversion member 22.

For a material of the bonding member 23, a resin composite that contains a transparent resin material as a base material can be used. The bonding member 23 has a transmittance of, for example, 60% or more for light having the emission peak wavelength the light-emitting element 21. In view of the effective use of light, the transmittance of the bonding member 23 at the emission peak wavelength of the light-emitting element 21 is preferably 70% or more, and more preferably 80% or more.

Typical examples of a base material of the bonding member 23 include a thermosetting resin such as an epoxy resin or a silicone resin. For the base material of the bonding member 23, a silicone resin, a silicone modified resin, an epoxy resin, a phenol resin, a polycarbonate resin, an acrylic resin, a polymethylpentene resin, a polynorbornene resin, or a material containing two or more of these materials may be used. The bonding member 23 typically has a refractive index lower than a refractive index of the lightguide plate 110A. The bonding member 23 may diffuse light. For example, a material having a refractive index different than that of the base material may be dispersed in the bonding member 23A to allow the bonding member 23 to diffuse light.

As described above, the bonding member 23 covers at least a portion of each of the lateral surfaces of the light-emitting element 21. The bonding member 23 has an outer surface, which is an interface with the light-reflective member 24 to be described below. Light emitted from a lateral surface of the light-emitting element 21 and incident on the bonding member 23 is reflected at an outer surface of the bonding member 23 toward above the light-emitting element 21. In a cross-sectional view, each outer surface of the bonding member 23 is not limited to be a straight line as shown in FIG. 5, but may be a zigzag line, a curved line that protrudes toward the light-emitting element 21, a curved line that protrudes away from the light-emitting element 21, etc.

The light-reflective member 24 is light-reflective, and is disposed covering the light-emitting element 21 and the bonding member 23. The light-reflective member 24 is also located on a surface of the light-emitting element 21 at which the electrodes 21t are located, and the electrodes 21t are exposed from the light-reflective member 24. Examples of a material of the light-reflective member 24 include a material similar to that of the light-reflective layer 30. For example, the same material may be used for the light-reflective member and the light-reflective layer 30. With the light-reflective member 24 covering a region of the lower surface of the light-emitting element 21 other than the electrodes 21t, it is possible to reduce light leakage toward the first primary surface 10a of the lightguide plate 10.

The light sources 20 can be obtained by, for example, arranging and bonding a plurality of light-emitting elements 21 in a two-dimensional array on the sheet-shaped wavelength conversion member 22 using the bonding member 23, filling gaps between the plurality of light-emitting elements 21 with the light-reflective member 24, and dividing the obtained structure into individual light sources.

Light-transmissive Members 50A and 50B

Figure 6A:
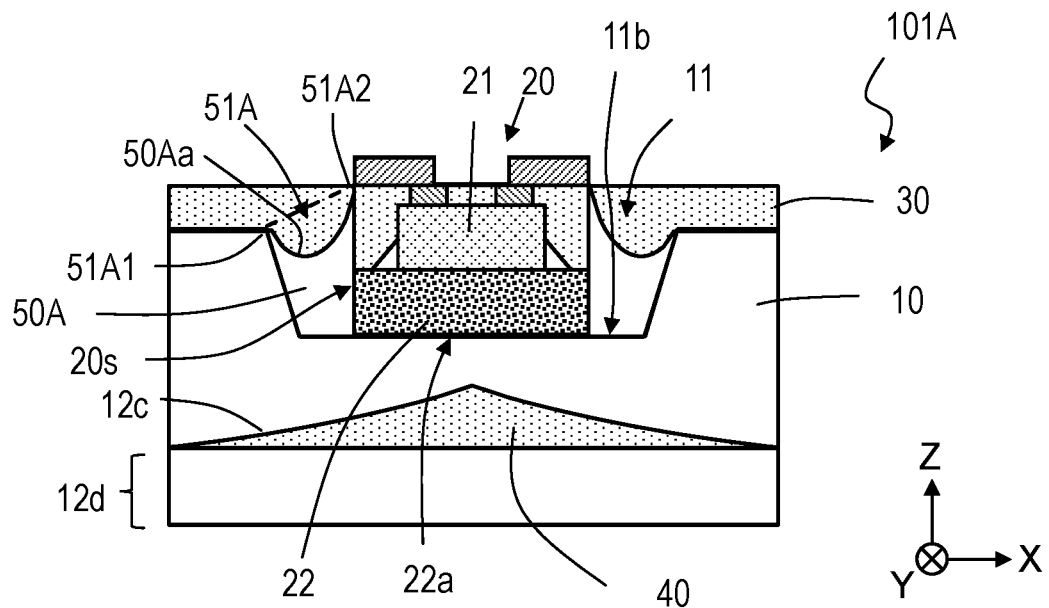
FIG. 6A is a schematic enlarged cross-sectional view of the first light-emitting unit of the light-emitting module shown in FIG. 1A.
Figure 6B:
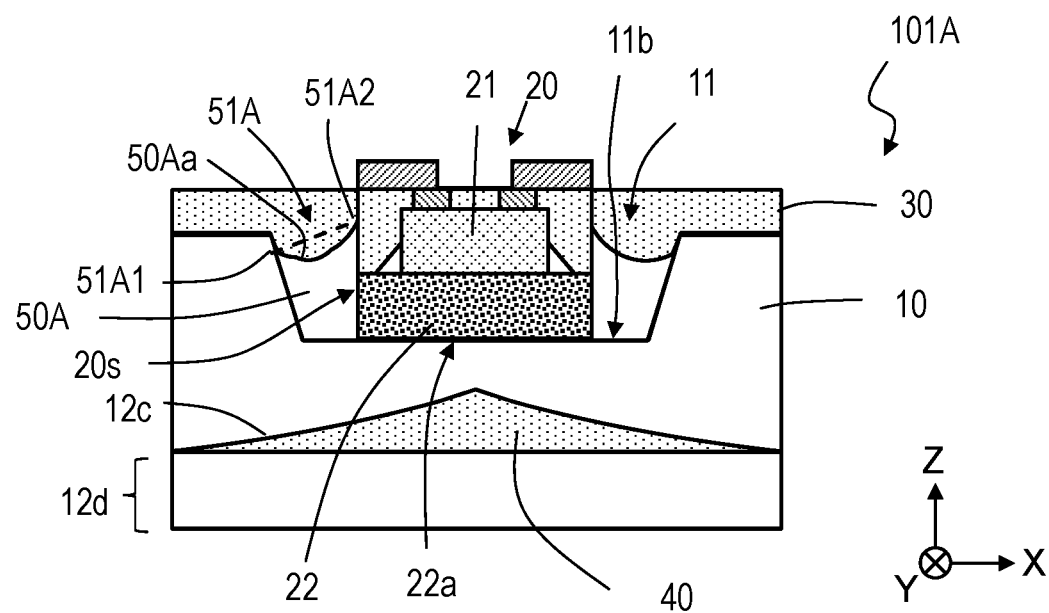
FIG. 6B is a schematic enlarged cross-sectional view showing another variation of the first light-emitting unit of the light-emitting module shown in FIG. 1A.
Figure 6C:
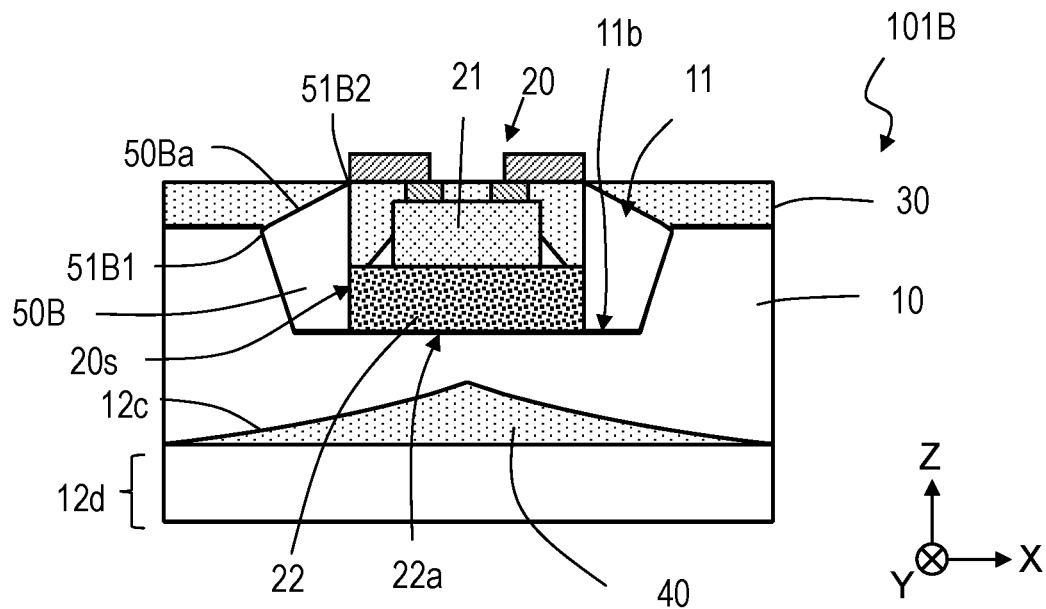
FIG. 6C is a schematic enlarged cross-sectional view of the second light-emitting unit of the light-emitting module shown in FIG. 1A.

FIG. 6A and FIG. 6C are schematic enlarged cross-sectional views showing the vicinity of the first recess 11 of the first light-emitting unit 101A and the second light-emitting unit 101B. For ease of understanding, the first light-emitting unit 101A and the second light-emitting unit 101B in FIG. 6A and FIG. 6C are illustrated upside down as compared with FIG. 3A and FIG. 4A such that the bottom of the first recess 11 is illustrated below an opening of the first recess 11 in FIG. 6A and FIG. 6C.

Each light source 20 is disposed in the first recess 11 of a corresponding one of the first and second light-emitting units 101A and 101B, and each of the light-transmissive members 50A and 50B is disposed in the first recess 11 so as to cover at least a portion of each of lateral surfaces 20s of the light source 20. It is preferable that the light source 20 is disposed in the first recess 11 so that the optical axis of the light source 20 coincides with the center of the first recess 11 in a plan view.

With the center of the first recess 11 and the center of the second recess 12 coincided with each other in a plan view, the light source 20 also coincides with the center of the second recess 12, which is the lens structure.

More specifically, the light source 20 is disposed in the first recess 11 such that a primary surface 22a, which is not bonded to the light-emitting element 21, of the wavelength conversion member 22 (i.e., the light extraction surface of the light source 20) faces a bottom 11b of the first recess 11. Each of the light-transmissive members 50A, and 50B covers at least a portion of a corresponding light source 20, and is arranged in the space of the first recess 11 that is not occupied by the light source 20.

As shown in FIG. 6A, in the first light-emitting unit 101A, an upper surface 50Aa of the light-transmissive member 50A forms a first depression 51A that extends toward the bottom 11b of the first recess 11. The upper surface 50Aa can be determined to form the first depression 51A when, for example, the upper surface 50Aa is located at a bottom 11b side with respect to a straight line (shown as a broken line in FIG. 6A) that connects a point 51A1, at which the upper surface 50Aa is in contact with the inner lateral surface defining the first recess 11, and the point 51A2, at which the upper surface 50Aa is in contact with the lateral surface 20s of the light source 20. It is preferable that the first depression 51A is formed along the four sides of the rectangular shape of the light source 20 so as to surround the light source 20 in a plan view.

In FIG. 6A, the light-transmissive member 50A is in contact with the entirety of the inner lateral surfaces defining the first recess 11 and the entirety of the lateral surfaces 20s of the light source 20. Therefore, the point 51A1 and the point 51A2 are located at the highest position of a corresponding inner lateral surface defining the first recess 11 and the highest position of a corresponding lateral surface 20s of the light source 20. Meanwhile, as shown in FIG. 6B, the point 51A1 and the point 51A2 may be located below the highest position of a corresponding inner lateral surface and a corresponding lateral surface 20s, respectively. The light-transmissive member 50A may be in contact with a portion of the inner lateral surface defining the first recess 11 and a portion of the lateral surface 20s of the light source 20.

In contrast, as shown in FIG. 6C, in the second light-emitting unit 101B, an upper surface 50Ba of the light-transmissive member 50B forms no depression. While the light-transmissive member 50B is disposed inside the first recess 11 in FIG. 6C, a portion of the light-transmissive member 50 may be located on the first primary surface 10a of the lightguide plate 10 around the first recess 11, as shown in FIG. 6D.

Figure 6D:
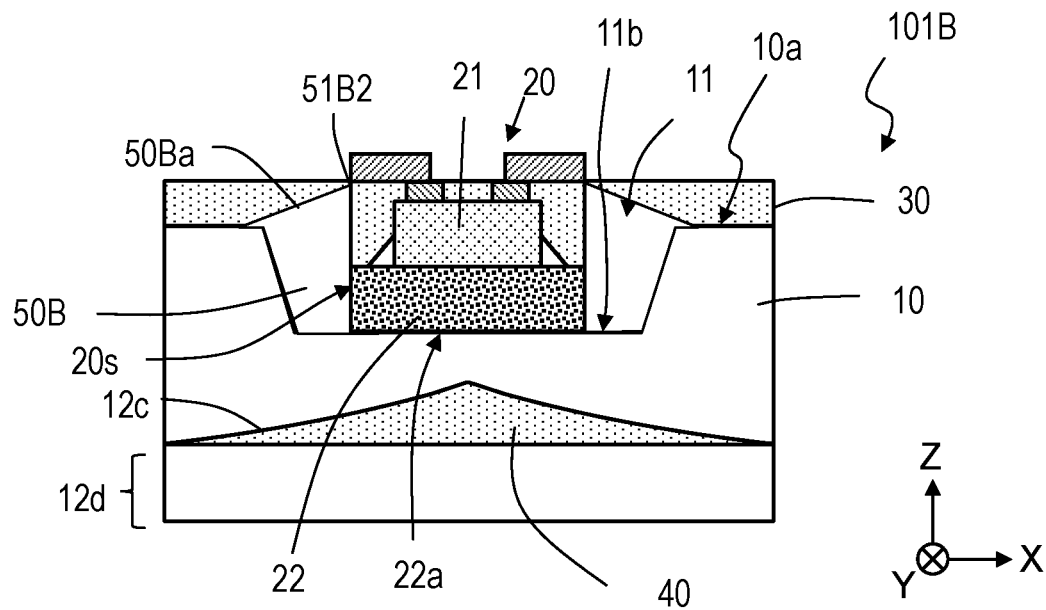
FIG. 6D is a schematic enlarged cross-sectional view showing another variation of the second light-emitting unit of the light-emitting module shown in FIG. 1A.
Figure 6E:
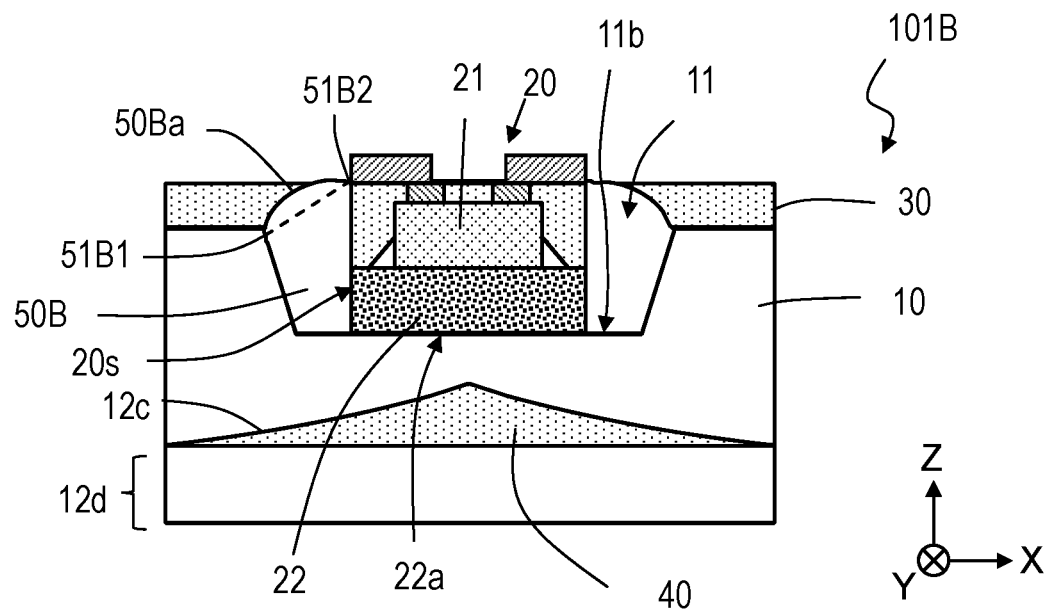
FIG. 6E is a schematic enlarged cross-sectional view showing another variation of the second light-emitting unit of the light-emitting module shown in FIG. 1A.
Figure 6F:
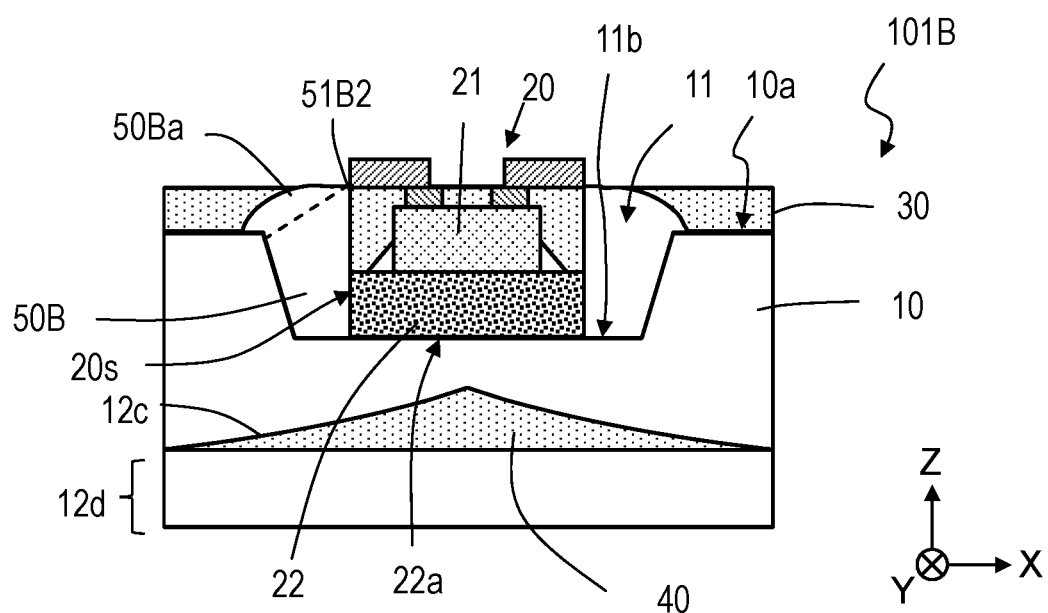
FIG. 6F is a schematic enlarged cross-sectional view showing another variation of the second light-emitting unit of the light-emitting module shown in FIG. 1A.

While the upper surface 50Ba is flat in FIG. 6C and FIG. 6D, the upper surface 50Ba may be protruded, i.e., may have a protruding shape, as shown in FIG. 6E. Also in such a case, a portion of the light-transmissive member 50 may be located on the first primary surface 10a of the lightguide plate 10 around the first recess 11, as shown in FIG. 6F.

The upper surface 50Aa of the light-transmissive member 50A and the upper surface 50Ba of the light-transmissive member 50B are covered by the light-reflective layer 30. Accordingly, the first light-emitting unit 101A and the second light-emitting unit 101B are different from each other in a shape of respective reflecting surfaces according to difference in shape between the upper surface 50Aa and the upper surface 50Ba, more specifically, whether or not the upper surface forms the first depression 51A.

The light-transmissive members 50A and 50B are made of a resin composite that contains a transparent resin material as the base material, as is the bonding member 23. For the light-transmissive member 50, a material different from, or the same as, a material of the bonding member 23 may be used. The light-transmissive member 50 typically has a lower refractive index than the refractive index of the lightguide plate 10.

A shape of the light-transmissive member 50A of the first light-emitting unit 101A and a shape of the light-transmissive member 50B of the second light-emitting unit 101B can be controlled by adjusting the amount of the uncured material of the light-transmissive member 50A, 50B to be arranged in the first recess 11 in consideration of, for example, the decrease in volume while being cured as will be described below.

A shape of the light-transmissive member 50A of the first light-emitting unit 101A and a shape of the light-transmissive member 50B of the second light-emitting unit 101B can be controlled by adjusting the amount of the uncured material of the light-transmissive member 50A, 50B to be arranged in the first recess 11 in consideration of, for example, the decrease in volume while being cured as will be described below.

Next, an uncured material of the light-transmissive members 50A and 50B is arranged in the first recesses 11 of the lightguide plate 210 using a dispenser, or the like. At this time, the uncured material is disposed such that the amount of the uncured material of the light-transmissive member disposed in the first recess 11 of each first unit region 211A to be each first light-emitting unit 101A is different from the amount of the uncured material of the light-transmissive member disposed in the first recess 11 of each second unit region 211B to be each second light-emitting unit 101B. More specifically, the amount of the uncured material for the first recess 11 of each first unit region 211A is reduced so that the first depression 51A is formed on the upper surface 50Aa of each light-transmissive member 50A when a respective light source 20 is disposed and the material is cured. Thereafter, the light sources 20 are disposed in respective ones of the first recesses 11, and the uncured material of the light-transmissive members is cured. Any appropriate number of the first and second light-emitting units 101A and 101B can be disposed in any appropriate arrangement.

Next, an uncured material of the light-transmissive members 50A and 50B is arranged in the first recesses 11 of the lightguide plate 210 using a dispenser, or the like. At this time, the uncured material is disposed such that the amount of the uncured material of the light-transmissive member disposed in the first recess 11 of each first unit region 211A to be each first light-emitting unit 101A is different from the amount of the uncured material of the light-transmissive member disposed in the first recess 11 of each second unit region 211B to be each second light-emitting unit 101B. More specifically, the amount of the uncured material for the first recess 11 of each first unit region 211A is reduced so that the first depression 51A is formed on the upper surface 50Aa of each light-transmissive member 50A when a respective light source 20 is disposed and the material is cured. Thereafter, the light sources 20 are disposed in respective ones of the first recesses 11, and the uncured material of the light-transmissive members is cured. Any appropriate number of the first and second light-emitting units 101A and 101B can be disposed in any appropriate arrangement.

Figure 7A:
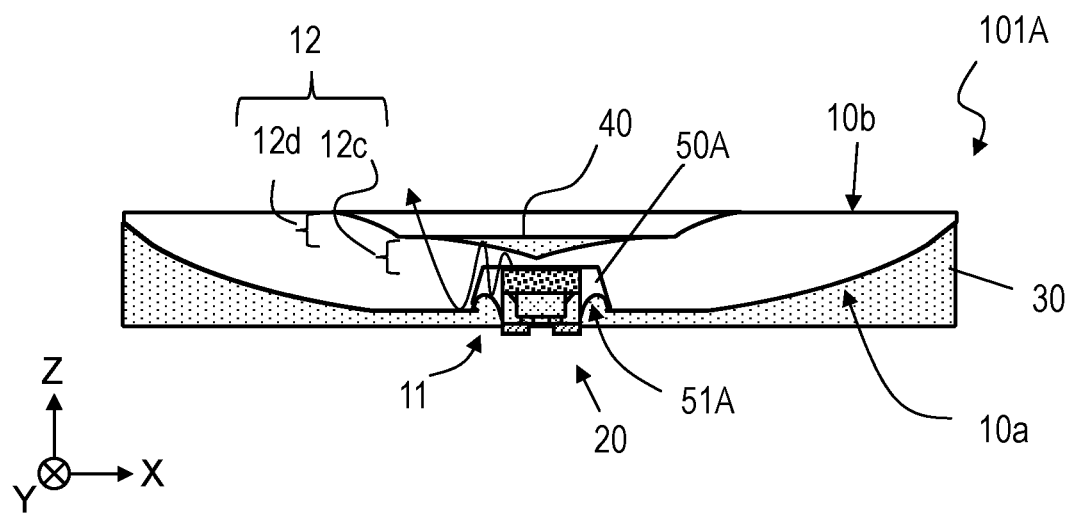
FIG. 7A is a schematic diagram for illustrating the light distribution characteristic of the first light-emitting unit of the light-emitting module shown in FIG. 1A.
Figure 7B:
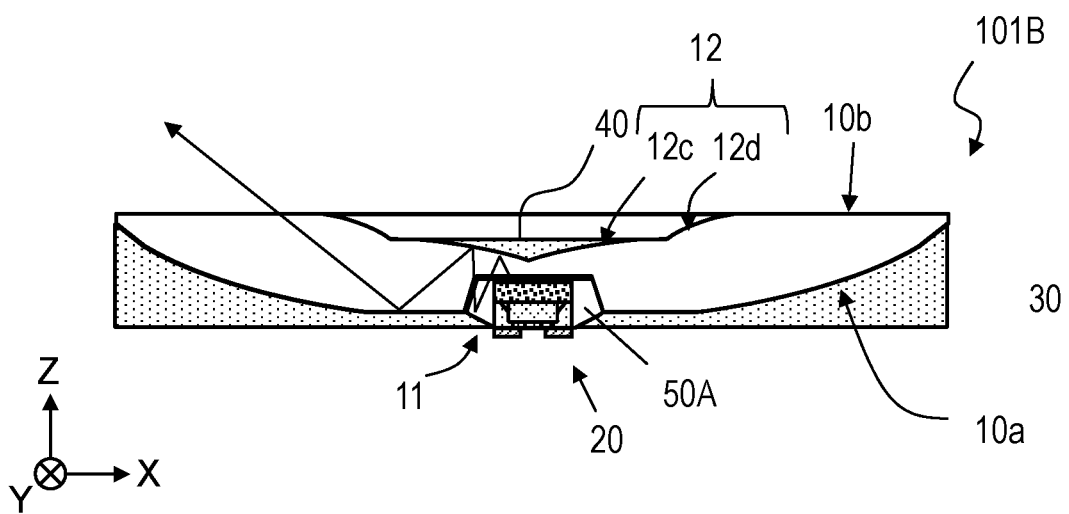
FIG. 7B is a schematic diagram for illustrating the light distribution characteristic of the second light-emitting unit of the light-emitting module shown in FIG. 1A.

Light Distribution Characteristic of First Light-emitting Unit 101A and Second Light-emitting Unit 101B Referring to FIG. 7A and FIG. 7B, the light distribution characteristics of the first light-emitting unit 101A and the second light-emitting unit 101B, and differences therebetween will be described. In each of the first and second light-emitting units 101A and 101B, light emitted from the light source 20 travels toward the second primary surface 10b of the lightguide plate. The second recess 12 is formed in the second primary surface 10b, and a portion of the light traveling toward the second primary surface 10b is reflected toward the first primary surface 10a by the light-reflective member 40 formed in the second recess 12. The light traveling toward the first primary surface 10a is reflected by the light-reflective layer 30 and travels back toward the second primary surface 10b.

Each light-reflective layer 30 forms an interface with the light-transmissive member 50A or 50B and the lightguide plate 10. With the light-transmissive members 50A and 50B each located adjacent to a corresponding light-emitting element 21, reflection at the interface with the light-transmissive member 50A or 50B influences the light distribution characteristics of the first light-emitting unit 101A and the second light-emitting unit 101B. More specifically, with the first depression 51A, a region of the upper surface 50Aa of the light-transmissive member 50A at the light source 20 side is more greatly inclined toward the light source 20. With this structure, light reflected at the upper surface 50Aa of the light-transmissive member 50A travels toward the first primary surface 10a while less spreading as compared with the light-transmissive member 50B in which the upper surface 50Ba does not have the first depression 51A. Therefore, as shown in FIG. 7A and FIG. 7B, the light distribution angle of the first light-emitting unit 101A is narrower than the light distribution angle of the second light-emitting unit 101B.

Use of Light-emitting Module 201

The first light-emitting unit 101A and the second light-emitting unit 101B have different light distribution characteristics from each other, and the light distribution angle of the first light-emitting unit 101A is narrower than the light distribution angle of the second light-emitting unit 101B. In the light-emitting module 201, any appropriate number of the first light-emitting units 101A may be disposed in any appropriate arrangement. Thus, the light-emitting module 201 can be used for multiple purposes while can have light distribution characteristics appropriate for various applications. For example, the light-emitting module 201 can be preferably used for a backlight device of a liquid crystal display device.

Figure 8A:
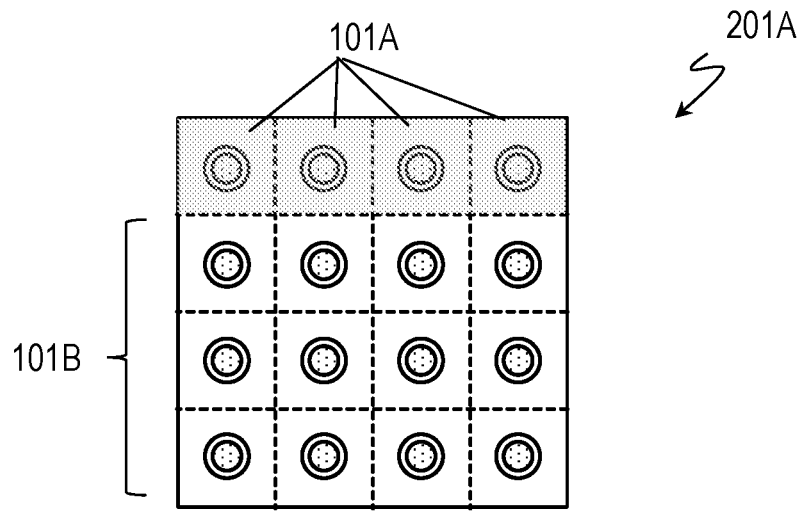
FIG. 8A is a schematic top view showing a configuration example of the light-emitting module.
Figure 8B:
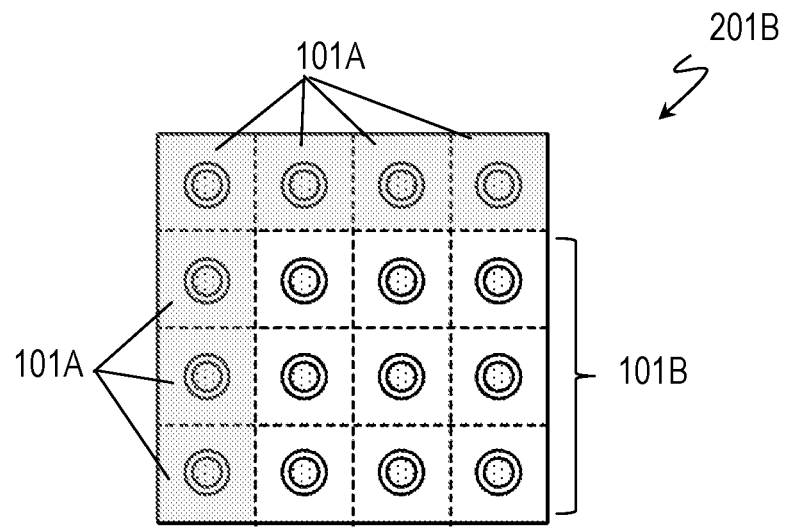
FIG. 8B is a schematic top view showing a configuration example of the light-emitting module.
Figure 8C:
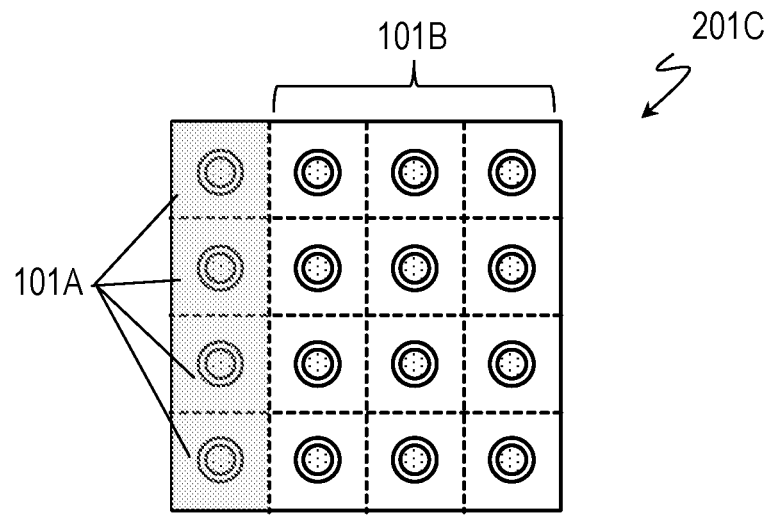
FIG. 8C is a schematic top view showing a configuration example of the light-emitting module.

For example, light-emitting modules 201A to 201C according to the present embodiment are provided as shown in FIG. 8A to FIG. 8C. As shown in FIG. 8A, the light-emitting module 201A includes four first light-emitting units 101A arranged in the first row, and twelve light-emitting units 101B arranged in the second to fourth rows. As shown in FIG. 8B, the light-emitting module 201B includes seven first light-emitting units 101A arranged in the first row and the first column, with nine light-emitting units 101B arranged in the other positions. As shown in FIG. 8C, the light-emitting module 201C includes four first light-emitting units 101A arranged in the first column, and twelve light-emitting units 101B in the second to fifth columns. That is, each of the light-emitting modules 201A to 201C includes a plurality of light-emitting units arranged in a two-dimensional array extending in the row direction and in the column direction, in which a plurality of first light-emitting units 101A are arranged in an outermost row and/or an outermost column of the plurality of light-emitting units. In such a case, the plurality of unit regions 211 of the lightguide plate 210 are arranged in a two-dimensional array extending in the row direction and in the column direction, in which a plurality of first unit regions 211A are arranged in an outermost row and/or an outermost column of the plurality of unit regions 211.

Figure 8D:
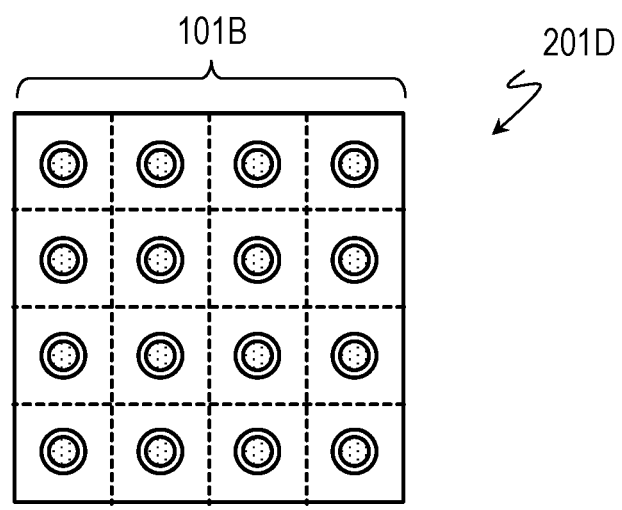
FIG. 8D is a schematic top view showing a configuration example of the light-emitting module.

On the other hand, as shown in FIG. 8D, a plurality of light-emitting units of a light-emitting module 201D include only second light-emitting units 101B. A plurality of light-emitting modules 201A to 201C and a plurality of light-emitting modules 201D according to the present embodiment are provided.

Figure 9:
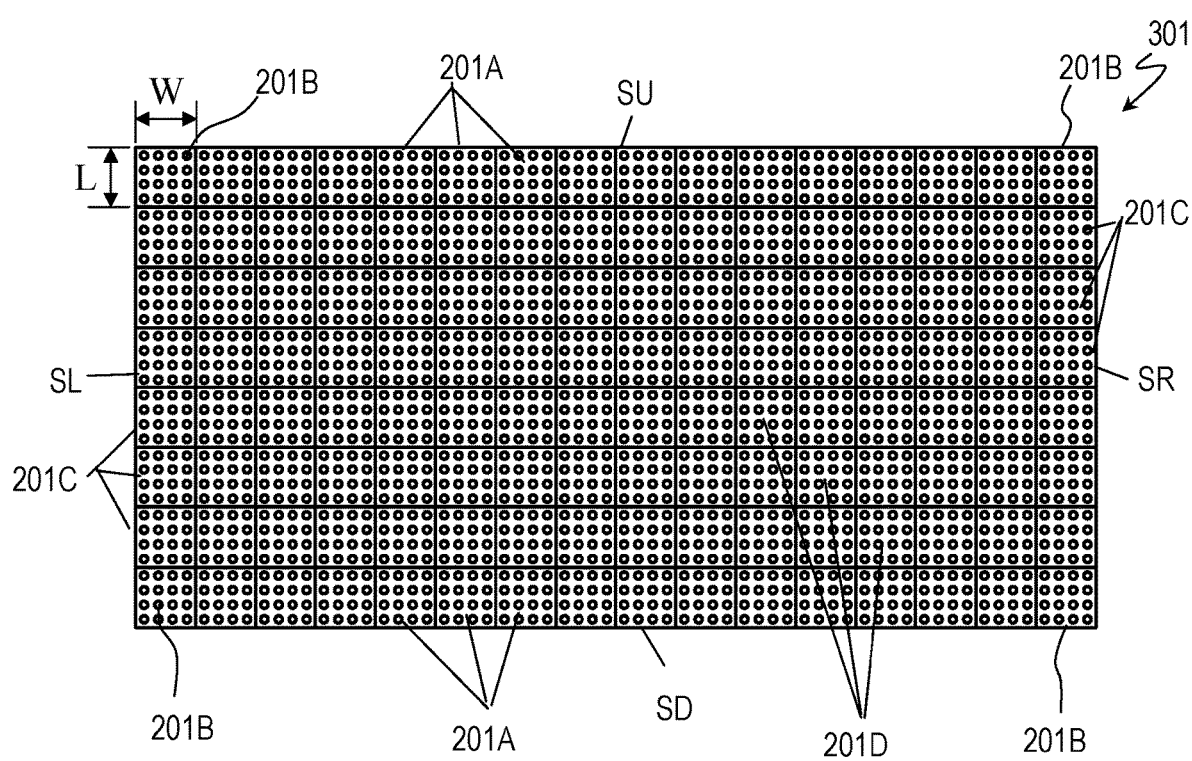
FIG. 9 is a schematic top view showing an example of a backlight device of the first embodiment.

FIG. 9 shows an example of a backlight device 301 that can be formed using the light-emitting modules 201A to 201D. The backlight device 301 includes the light-emitting modules 201A to 201D arranged in eight rows by sixteen columns. For example, when the longitudinal length L and the lateral length W of the light-emitting modules 201A to 201D are about 24.3 mm and about 21.5 mm, respectively, the backlight device 301 is suitable for a liquid crystal display panel with an aspect ratio of 16:9 and a screen size of 15.6 inches.

In the backlight device 301, the light-emitting modules 201A to 201D are arranged such that the first light-emitting units 101A are adjacent to the four sides SU, SD, SR and SL. More specifically, the light-emitting modules 201B are arranged at the four corners of the backlight device 301, i.e., the corner between the side SL and the side SU, the corner between the side SU and the side SR, the corner between the side SR and the side SD and the corner between the side SD and the side SL. At each of the four corners, the light-emitting module 201B is disposed in such an orientation that the first light-emitting units 101A, are located at an outermost side of the backlight device 301.

Six light-emitting modules 201C are arranged at positions along each of the sides SL and SR except for the corners described above. At each of these positions, the light-emitting module 201C is disposed in such an orientation that the first light-emitting units 101A are located at an outermost side of the backlight device 301. Fourteen light-emitting modules 201A are arranged at positions along each of the sides SU and SD except for the corners described above. At each of these positions, the light-emitting module 201A is disposed in such an orientation that the first light-emitting units 101A are located at an outermost side of the backlight device 301. At positions other than the outermost light-emitting modules, the light-emitting modules 201D are arranged in six rows by fourteen columns.

In the row direction or the column direction, the lightguide plates 210 of two adjacent light-emitting modules are typically in direct contact with each other. Meanwhile, a lightguide structure optically coupling the lightguide plates together may be disposed between two adjacent lightguide plates 210. For example, such a lightguide structure can be formed by applying a light-transmissive adhesive onto the lateral surface of the lightguide plate 210, and then curing the applied adhesive. Alternatively, a lightguide structure may be formed by two-dimensionally arranging a plurality of light-emitting modules 201A to 201D with an interval therebetween, filling the area between two adjacent lightguide plates 210 with a light-transmissive resin material, and then curing the resin material. For the lightguide structure located between lightguide plates 210, a material similar to a material used for the bonding member 23 described above may be used.

Respective corresponding ones of the wiring layers 60 of the light-emitting modules 201A to 201D of the backlight device 301 may be electrically connected together so that the light-emitting modules 201A to 201D can be driven simultaneously, or respective corresponding ones of the wiring layers 60 of the light-emitting modules may be electrically connected together so that one or more light-emitting modules can be driven separately so as to perform local dimming.

In the backlight device 301, the outermost ones of the plurality of light-emitting units arranged in a two-dimensional array have a narrower light distribution angle than the other light-emitting units. This structure allows for reducing light leakage to the outside of the backlight device 301. In particular, when the backlight device 301 is used in a liquid crystal display device with a narrow bezel, it may be more difficult to form a structure for shielding light spreading outward from the backlight device due to the narrow width of the peripheral portion of the display panel. Even in such a case, using the backlight device 301 allows for reducing light leakage. On the other hand, the light-emitting units other than the outermost light-emitting units have a wide light distribution angle, and it is therefore possible to reduce unevenness in luminance in a large portion of the light-emitting surface. Therefore, using the light-emitting modules 201A to 201D allows for obtaining the backlight device 301 having such desirable light-emitting characteristics.

As described above, any appropriate number of light-emitting units that have a narrow light distribution angle may be arranged in any appropriate arrangement in the light-emitting module 201. Light-emitting units with a narrow light distribution angle can be produced adjusting the amount of the uncured material of the light-transmissive member to be arranged in the first recess 11. Accordingly, it is not necessary to provide various types of lightguide plates 210 according to the positions and the number of light-emitting units with a narrow light distribution angle, and it is not necessary to provide different types of light sources 20 with different light distribution angles. Moreover, the size or the aspect ratio of the screen as a surface light source can be appropriately changed according to the number of combinations of light-emitting modules. Thus, the light-emitting module 201 can be used for multipurpose and can have a light-emitting characteristic appropriate for intended use.

SECOND EMBODIMENT

Figure 10A:
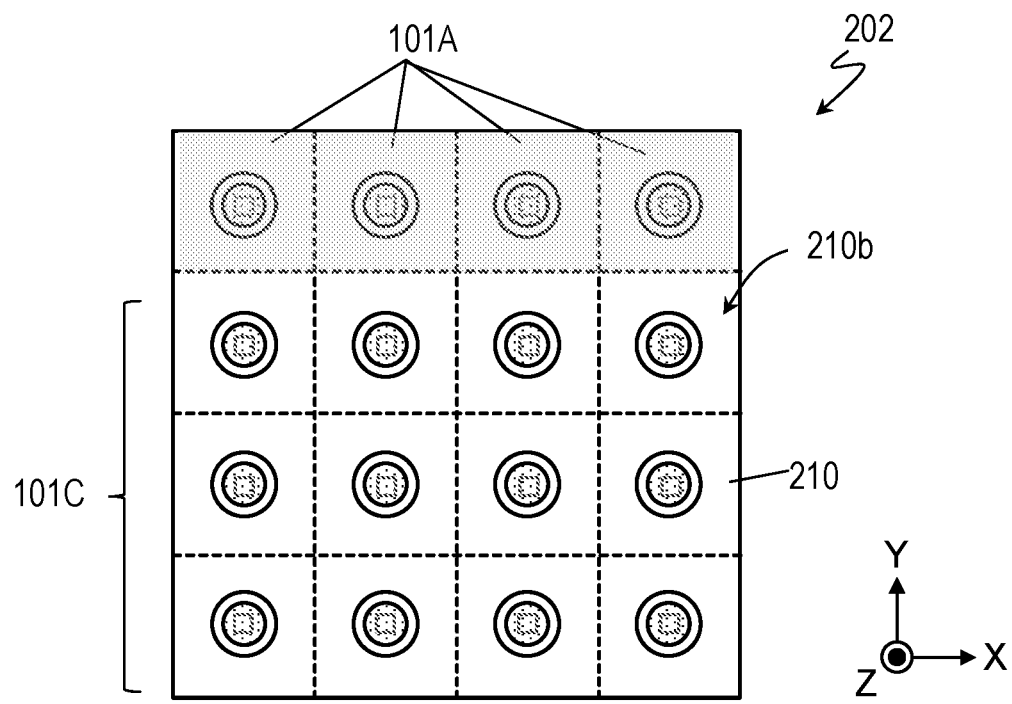
FIG. 10A is a schematic top view showing an embodiment of the light-emitting module.
Figure 11:
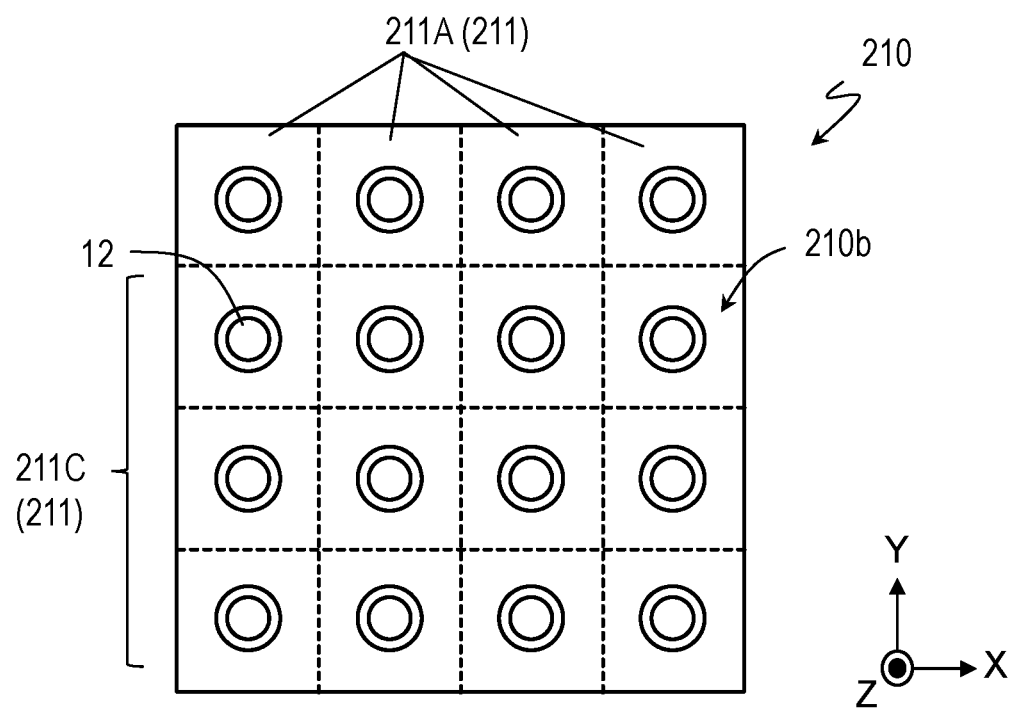
FIG. 11 is a schematic top view of a lightguide plate of the light-emitting module shown in FIG. 10A.

FIG. 10A is a schematic top view of a light-emitting module 202. The light-emitting module 202 is different from the light-emitting module 201 of the first embodiment in that the light-emitting module 202 includes a third light-emitting unit 101C instead of the second light-emitting unit 101B. That is, the light-emitting module 202 includes a plurality of first light-emitting units 101A and a plurality of third light-emitting units 101C. As shown in FIG. 11, the lightguide plate 210 includes third unit regions 211C at positions corresponding to the third light-emitting units 101C.

Figure 10B:
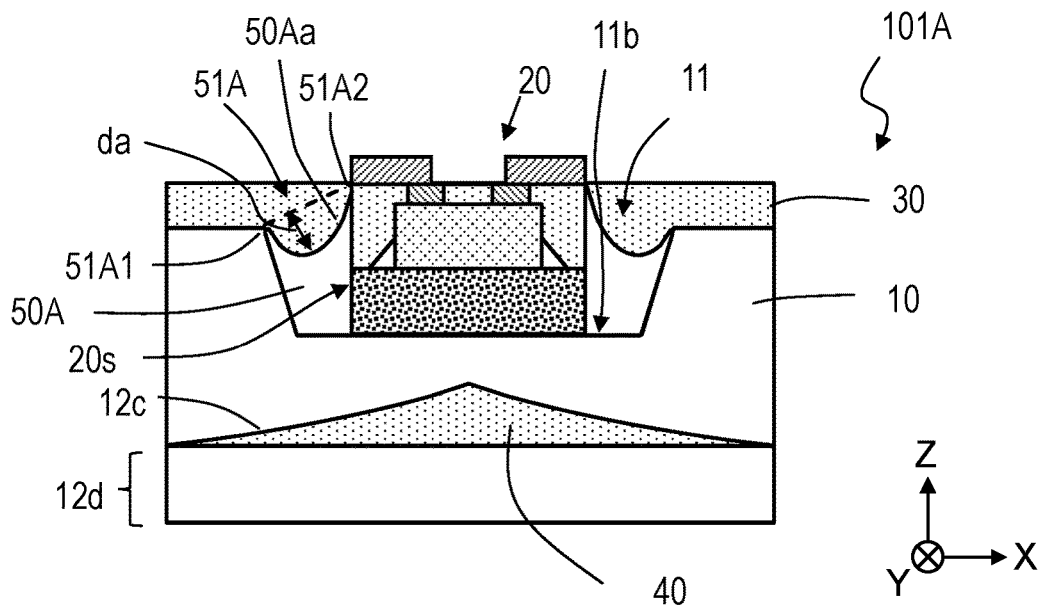
FIG. 10B is a schematic enlarged cross-sectional view of a first light-emitting unit of the light-emitting module shown in FIG. 10A.
Figure 10C:
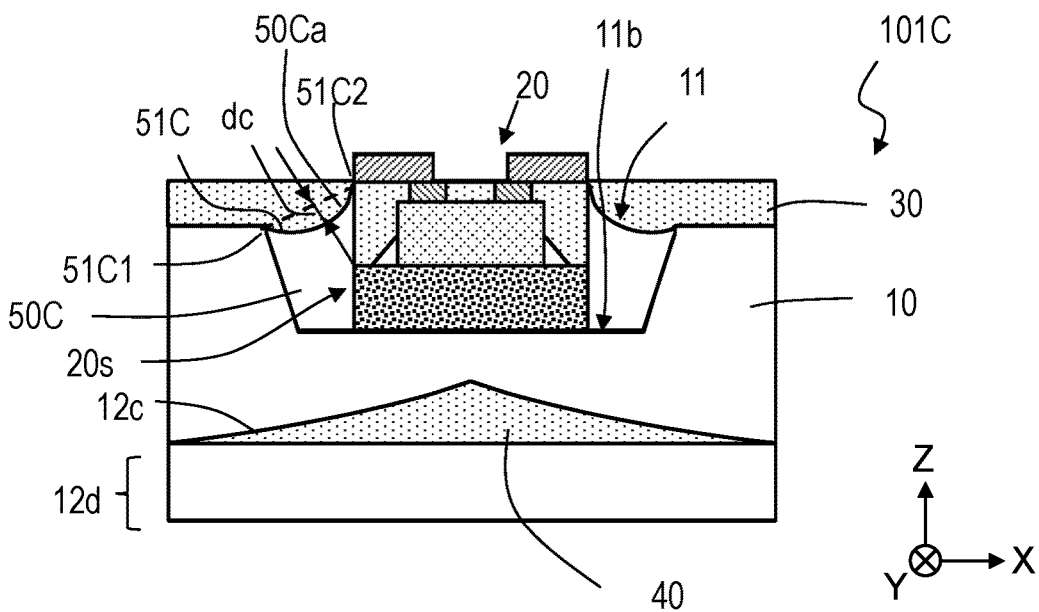
FIG. 10C is a schematic enlarged cross-sectional view of a third light-emitting unit of the light-emitting module shown in FIG. 10A.

FIG. 10B and FIG. 10C are schematic enlarged cross-sectional views showing the vicinity of the first recess 11 of the first light-emitting unit 101A, and the third light-emitting unit 101C. The first light-emitting unit 101A in the second embodiment has a structure that is the same as the structure of the first light-emitting unit 101A of the first embodiment.

As shown in FIG. 10C, in the third light-emitting unit 101C, an upper surface 50Ca of the light-transmissive member 50C forms a third depression 51C that is depressed toward the bottom 11b of the third recess 11. The third depression 51C has a depth dc smaller than a depth da of the first depression 51A of the first light-emitting unit 101A. Herein, the depth dc refers to a distance, on a cross section, measured at an angle perpendicular to a straight line that connects the point 51C1 in contact with the inner lateral surface defining the first recess 11 of the upper surface 50Ca and the point 51C2 in contact with a lateral surface 21s of the light-emitting element 21. The depth da is defined similarly.

With the depth dc of the third depression 51C of the third light-emitting unit 101C smaller than the depth da of the first depression 51A of the first light-emitting unit 101A, the light distribution angle of the third light-emitting unit 101C is wider than the light distribution angle of the first light-emitting unit 101A. Accordingly, producing a plurality of types of light-emitting modules as shown in FIG. 8A to FIG. 8C using the light-emitting module 202 allows for obtaining a backlight device that has an effect similar to that in the first embodiment.

Variations

The light-emitting module of the present disclosure is not limited to those described in the embodiments described above, and various modifications can be made thereto. For example, the first light-emitting units 101A having a narrow light distribution angle may be arranged at positions other than in the outermost rows or columns of the light-emitting module. The light-emitting module include at least one first light-emitting unit 101A, and the light-emitting module may consist of a plurality of first light-emitting units 101A. When the light-emitting module includes a plurality of first light-emitting units 101A, the first light-emitting units 101A may be arranged adjacent to and sequentially with each other or may be arranged in a discrete and separate manner.

For example, when the light-emitting module of the present disclosure is used in a display device of an apparatus for use in various fields, the status of the apparatus, information for operating the apparatus, etc., may be displayed at a predetermined position on the screen of the display device. In such a case in which such predetermined information is displayed in a predetermined area of the screen of the display device, the characteristic of the backlight device in the predetermined area may be set to be different from other areas. For example, when the light-emitting module is configured such that the first light-emitting units 101A are arranged in the predetermined area, the light distribution angle in the predetermined area is narrow, so that the luminance when viewed from a front side can be increased in the predetermined area. Accordingly, visibility of information displayed in the predetermined area when viewed from a front side can be increased.

Certain embodiments of the present disclosure can be applied for various surface light sources of various applications. In particular, certain embodiments of the present disclosure is advantageously applicable to backlight units for liquid crystal display devices. The light-emitting module and the surface-emitting light source according to certain embodiments of the present disclosure can be appropriately used in backlight devices for display devices of mobile devices, for which there are strong demands for reducing the thickness, surface-emitting devices configured to perform local dimming, etc.

While exemplary embodiments of the present disclosure have been described, it is understood that the words that have been used are words of description and illustration, rather than words of limitation. The present disclosure may be modified in numerous ways and may assume many embodiments other than those specifically described above. Accordingly, the appended claims are intended to cover all modifications, enhancements, and other embodiments of the present disclosure that fall within the spirit and scope of the invention.

What is claimed is:

1. A light-emitting module comprising:
    a lightguide plate including:
        a first primary surface,
        a second primary surface opposite to the first primary surface, and
        a plurality of unit regions arranged in a one-dimensional or two-dimensional array,
    the lightguide plate defining a plurality of first recesses in the first primary surface, each of the first recesses located in a respective one of the plurality of unit regions;
    a plurality of light sources disposed at the first primary surface of the lightguide plate, each of the plurality of light sources disposed in the first recess in a corresponding one of the plurality of unit regions; and
    a plurality of light-transmissive members each disposed in the first recess in a respective one of the plurality of unit regions so as to cover at least a portion of each of lateral surfaces of a corresponding one of the plurality of light sources, wherein:
    the plurality of unit regions include at least one first unit region, and
    in the at least one first unit region, an upper surface of the light-transmissive member forms a first depression that extends toward a bottom of the first recess.

2. The light-emitting module according to claim 1, wherein:
    the plurality of unit regions include a plurality of the first unit regions;
    in each of the plurality of unit regions, the upper surface of the light-transmissive member has the first depression that extends toward the bottom of the first recess.

3. The light-emitting module according to claim 1, wherein:
    the plurality of unit regions include:
        a plurality of the first unit regions, in each of which the upper surface of a corresponding one of the plurality of light-transmissive members forms the first depression, and
        a plurality of second unit regions, in each of which the upper surface of a corresponding one of the plurality of light-transmissive members does not form a depression.

4. The light-emitting module according to claim 1, wherein:
    the plurality of unit regions include:
        a plurality of the first unit regions, in each of which the upper surface of a corresponding one of the plurality of light-transmissive members forms the first depression, and
        a plurality of third unit regions, in each of which the upper surface of the light-transmissive member forms a third depression that extends toward the bottom of the first recess, and
    a depth of the third depression is smaller than a depth of the first depression.

5. The light-emitting module according to claim 3, wherein:
    the plurality of unit regions are arranged in a two-dimensional array extending in a row direction and in a column direction; and
    the first unit regions are arranged in an outermost row or column.

6. The light-emitting module according to claim 4, wherein:
    the plurality of unit regions are arranged in a two-dimensional array extending in a row direction and in a column direction; and
    the first unit regions are arranged in an outermost row or column.

7. The light-emitting module according to claim 1, further comprising a plurality of lens structures located at the second primary surface of the lightguide plate, wherein the plurality of lens structures are arranged such that each of the plurality of lens structures corresponds to a respective one of the plurality of unit regions.

8. The light-emitting module according to claim 1, wherein, in each of the plurality of unit regions, an optical axis of the light source coincides with a center of the first recess in the first primary surface.

* * * * *